United States Patent [19]

Tarusawa et al.

[11] Patent Number: 4,980,652
[45] Date of Patent: Dec. 25, 1990

[54] FREQUENCY SYNTHESIZER HAVING COMPENSATION FOR NONLINEARITIES

[75] Inventors: Yoshiaki Tarusawa; Shigeki Saito, both of Yokohama; Yasushi Yamao; Toshio Nojima, both of Yokosuka, all of Japan

[73] Assignee: Nippon Telegraph and Telephone Corporation, Tokyo, Japan

[21] Appl. No.: 400,665

[22] Filed: Aug. 31, 1989

[30] Foreign Application Priority Data

Sep. 2, 1988 [JP] Japan .................................. 63-218586
Oct. 7, 1988 [JP] Japan .................................. 63-254199
Nov. 18, 1988 [JP] Japan .................................. 63-291999

[51] Int. Cl.$^5$ ............................................. H03L 7/189
[52] U.S. Cl. ..................................... 331/1 A; 331/10; 331/14; 331/16; 331/17; 331/25
[58] Field of Search ..................... 331/1 A, 10, 14, 16, 331/17, 25

[56] References Cited

U.S. PATENT DOCUMENTS 4,410,860 10/1983 Kipp et al. .......................... 331/1 A
4,511,858 4/1985 Chararit et al. ....................... 331/10
4,562,410 12/1985 O'Rourke ............................ 331/1 A

OTHER PUBLICATIONS

Ulrich L. Rohde, Ph.D., Sc.D., *Digital PLL Frequency Synthesizers*, N.J., Prentice-Hall, Inc., 1983, pp. 14–18.
Vadim Manassewitsch, *Frequency Synthesizers Theory and Design*, N.Y., John Wiley & Sons, 1976, pp. 258–264.

*Primary Examiner*—Siegfried H. Grimm
*Attorney, Agent, or Firm*—Cushman, Darby & Cushman

[57] ABSTRACT

In a phase locked loop frequency synthesizer, the frequency of a VCO is switched by changing the division ratio of a variable ratio frequency divider in the feedback path of the loop. At the time of switching, a prepositioning voltage is applied to the VCO to realize fast frequency switching. To correct for nonlinear response of the VCO, the prepositioning voltage is adjusted according to information received from a voltage measuring circuit connected to the VCO control circuit.

11 Claims, 23 Drawing Sheets

FREQUENCY SYNTHESIZER HAVING COMPENSATION FOR NONLINEARITIES

FIELD OF THE INVENTION

This invention relates to a frequency synthesizer to be used for multichannel access type systems. More particularly, this invention relates to a frequency synthesizer which has a high frequency stability and a low phase noise, and is capable of high speed switching of its oscillation frequency. More specifically, this invention relates to a frequency synthesizer which uses a phase-locked loop (PLL), and is adapted to supply a control voltage to a voltage-controlled oscillator from outside of the phase-locked loop (PLL), at the time of oscillation frequency switching, in order to shorten the settling time of the PLL.

This invention is suitable for application as a local oscillator or a carrier oscillator in a radio transmitter/receiver.

BACKGROUND OF THE INVENTION

A frequency domain multichannel access system has been widely used in recent years to satisfy a large number of call requests without failure and to increase the utilization efficiency of frequencies. The multichannel access system is characterized in that a large number of channels are used to construct the system, which is allocated to a large number of subscribers, so that a subscriber may use a vacant channel within the system for his/her call. This system requires a frequency synthesizer which is capable of switching a large number of frequencies easily. It is desirable to reduce the time required for frequency switching in order to realize non-interruption hand-over during the communication.

A frequency synthesizer using a PLL (phase-locked loop) is currently the most prevailing type. A PLL frequency synthesizer phase-locks the output signals from a voltage controlled oscillator (VCO) and the output signals from a reference oscillator. Therefore, if a reference oscillator with a high frequency stability is used, an output with an extremely stable frequency can be obtained in the steady state. The frequency is switched by changing the division ratio, as set at a frequency divider, inside the PLL. The time required for switching frequencies of the PLL frequency synthesizer is determined by the closed-loop bandwidth, which is dependent on the reference frequency, the phase detector gain, etc. Especially when the output frequency spacing has to be set at a narrow value, the closed-loop bandwidth cannot be increased, because the division ratio requires a large value.

Frequency switching of the PLL frequency synthesizer and the conventional method for reducing the time of frequency switching will be described below.

FIG. 1 is a block diagram to show the construction of a conventional PLL frequency synthesizer. The frequency synthesizer comprises a phase detector 1, a variable ratio divider 2, a loop filter 3, and a voltage controlled oscillator 4 (hereinafter referred to as VCO). This circuit forms a phase locked loop or PLL, wherein the output phase of VCO 4 is synchronized with the phase of the reference signal at steady-state. If it is assumed that the frequency of the reference signal is denoted as $f_1$, the output frequency of VCO 4 as $f_0$, and the division ratio of the variable ratio divider 2 as N, the output frequency $f_0$ in the phase locked state can be expressed as the equation (1)

$$f_0 = N \cdot f_1 \quad (1)$$

The output frequency may be switched from $f_{01}$ to $f_{02}$ by switching the division ratio from $N_1$ to $N_2$. If a stable reference signal is supplied, plural stable frequencies may be obtained by switching the division ratio setting at the divider 2. For instance, if the reference signal $f_1$ is 12.5 kHz, the output frequency may be set stepwise from 1.60 GHz to 1.625 GHz by varying the division ratio N from 128,000 to 130,000.

FIG. 2 shows an example of the transient behavior of the PLL frequency synthesizer during frequency switching. More specifically, when the division ratio set at the divider 2 is switched at the time $t_0$, the output frequency needs a certain time (time for switching frequency) before it reaches a target frequency $f_{02}$. During the transient time, voltage $V_c$ of the capacitor 19 in loop filter 3 in FIG. 1 changes from $V_{c1}$ to $V_{c2}$ as shown in FIG. 2. The frequency switching time needs to include at least the time necessary for charging and discharging the capacitor. For instance, if it is assumed that the output frequency is in the 1.6 GHZ band and the reference signal frequency is 12.5 kHz, the time required is in the range of 50 ms.

In order to reduce the frequency switching time, there has been proposed a frequency synthesizer having the construction shown in FIG. 3. The construction differs from that of the synthesizer of FIG. 1 in that it is provided with a D/A converter 6 and an adder 5. The adder 5 outputs the sum of the output voltage $V_{da}$ of the D/A converter 6 and the output from the loop filter 3 as the output for the control or steering voltage $V_s$ of VCO 4. As no electric current passes through the resistors $R_1$ and $R_2$ in FIG. 3 in the steady state, the voltage $V_c$ of the capacitor becomes identical to the output from the loop filter 3. Accordingly, the steering voltage $V_s$ of VCO 4 can be expressed by the equation (2)

$$V_s = V_c + V_{da} \quad (2)$$

It is assumed that the current output frequency is denoted as $f_{01}$, and the steering voltage for VCO 4 corresponding thereto as $V_{s1}$. If the relation $V_{da} = V_{s1}$ holds, it will hold that $V_c = 0$. If the frequency is to be switched from $f_{01}$ to $f_{02}$, the division ratio of the variable ratio divider 2 needs to be switched from $N_1$ to $N_2$. In the steady state after switching, the VCO controlling voltage corresponding to the frequency $f_{02}$ is assumed to be $V_{s2}$, and if the relation $V_{da} = V_{s2}$ is set as soon as the division ratio is switched, the relation $V_c = 0$ holds or the voltage of the capacitor stays at 0 volts. This reduces the charging/discharging time of the capacitor in the loop filter. The transient behavior would be the same as that of the construction shown in FIG. 1 if the voltage Vda were unchanged despite the frequency switching. By using the construction of FIG. 3, the time necessary to switch between frequencies is shortened as shown in FIG. 4.

The operation will be further analyzed below. In VCO 4, the relation between the output frequency f and the steering voltage $V_s$ is varied due to changes in temperature, etc. It is assumed that the behavior at the time of frequency switching shows linear voltage controlled characteristics as shown in FIG. 5. The frequency variation of the VCO is extremely small compared to the oscillation frequency, and the frequency drift $\Delta V_0$ could be regarded as constant irrespective of the steering voltage $V_s$. In FIG. 5, at the time $t=t_0$, and when the output frequency $f_0$ is $f_{01}$, the steering voltage $V_s$ would be $V_{s1}$. When the output frequency of VCO changes by the drift $\Delta f_0$, the steering voltage $V_s$ decreases by the amount of drift compensation voltage $\Delta V_s$ by the operation of the PLL so as to maintain the output frequency at $f_{01}$. More particularly, the drift compensation voltage $-\Delta V_c$ ($=-\Delta V_s$), necessary to compensate the frequency drift $\Delta f_0$ is generated at the capacitor in the loop filter. The output frequency can be quickly switched from $f_{01}$ to $f_{02}$ by setting a steering voltage $V_{s2}$ at the D/A converter disregarding the drift compensation voltage $\Delta V_c$. The VCO steering voltage is set at a value corresponding to a desired frequency ($V_{s2} - \Delta V_s$). In this way, the frequency may be switched without changing the voltage at the capacitor.

However, even though the frequency change is maintained constant irrespective of the steering voltage, the relation between the steering voltages of the VCO and the output frequencies $f_0$ is not absolutely linear, as shown in FIG. 6. For instance, the electrical tuning capacitor C of the VCO may use a varactor diode. In this case, if the drift compensation voltage $\Delta V_{s2}$ is set as it is, errors will be caused which are equivalent to the difference of the drift compensation voltages $\Delta V_{s1}$ and $\Delta V_{s2}$, and the PLL works to charge/discharge the capacitor in order to compensate for the difference. Therefore, the time required for frequency switching is increased.

Moreover, the reference signal phase and the output phase of the variable ratio divider do not always agree immediately after the controlling voltage data is set in the D/A converter. The PLL works to cancel the phase errors to thereby vary the output frequency as shown in FIG. 4.

Because of these reasons, the time required for frequency switching could not heretofore be reduced beyond a certain time.

This invention was conceived to eliminate such problems encountered in the prior art and aims to provide a frequency synthesizer which is capable of high speed switching of oscillation frequency.

SUMMARY OF THE INVENTION

According to the first aspect of this invention, there is proposed a frequency synthesizer which measures a frequency controlling voltage of a voltage-controlled oscillator and corrects the errors of the oscillation frequency after switching based on the measured value.

More particularly, the invention provides a frequency synthesizer which includes a voltage controlled oscillator, a variable ratio divider which divides the output from the oscillator, a phase detector which compares the output phase from the variable ratio divider with the phase of the reference signal, a loop filter which smooths the output phase from the variable ratio divider based on the phase of the reference signal, a loop filter which smooths the output from the detector and supplies the same to said voltage controlled oscillator, and an oscillation frequency switching means which switches the oscillation frequency of said oscillator by changing the division ratio of said variable ratio divider wherein said oscillation frequency switching means including switches for the oscillation frequency of the oscillator by changing the division ratio of the variable ratio divider wherein the oscillation frequency switching means includes a voltage supply means which supplies a steering voltage of the voltage controlled oscillator corresponding to the oscillation frequency after switching to the voltage controlled oscillator via the D/A converter in synchronization with the change of the division ratio of the divider. This synthesizer of the present invention is characterized in that the voltage controlled oscillator is an oscillator of which the frequency changes nonlinearly in respect of input steering voltage, and which includes a voltage measurement means which measures by means of an A/D converter the voltage which has been supplied to the voltage controlled oscillator through the loop filter before switching of the oscillation frequency, and the voltage supply means includes a steering voltage correction means which corrects the steering voltage to be supplied to the voltage controlled oscillator based on the value measured by the voltage measurement means correspondingly to the non-linearity of the voltage controlled oscillator. The steering voltage correction means preferably includes a means which adds to the output from the loop filter a voltage value which is expressed as below, $$V_{s2} - (\Delta V_{s2} - \Delta V_{s1})$$

wherein the value obtained by the voltage measurement means is represented as $\Delta V_{s1}$, the drift in oscillation frequency of the voltage controlled oscillator caused by the voltage $-\Delta V_{s1}$ as $\Delta f_0$, the steering voltage corresponding to the oscillator frequency after switching as $V_{s2}$, the voltage required to vary the oscillator frequency of the oscillator after switching of the frequency the amount of $\Delta f_0$ as $-\Delta V_{s2}$.

The second aspect of this invention provides a frequency synthesizer which does not cause phase errors substantially between the reference signal and the output from the divider by triggering the reference signal to reset the variable ratio divider.

More particularly, the frequency synthesizer includes a voltage controlled oscillator, a variable ratio divider which divides the frequency of the output from the voltage controlled oscillator, a phase detector which compares the output phase of the variable ratio divider with the phase of the reference signal, a loop filter which smoothens the output from the detector and supplies it to the voltage controlled oscillator, and an oscillation frequency switching means which switches the frequency oscillated by the voltage controlled oscillator varying the division ratio of the variable ratio divider, wherein the switching means includes a voltage supply means which supplies a steering voltage corresponding to the oscillation frequency after switching in synchronization with the changes of dividing ratio of the divider to the voltage controlled oscillator via the D/A converter. This invention synthesizer is characterized in that the variable ratio divider is a variable ratio divider with a reset means, and the oscillation frequency switching means includes a means which is triggered by the reference signal inputted at the phase detector to reset the variable ratio divider.

The loop filter is preferably provided with a loop switch at an input thereof, and the oscillation frequency switching means preferably includes a switch ON/OFF means which opens the loop switch before switching the oscillation frequency and closes it after the variable ratio divider is reset.

It is most desirable to have both the first and second aspects of this invention concurrently.

The frequency synthesizer having either one or both in combination of the first and the second aspects of the invention may include a means which stops the power supply to the D/A converter after a sample hold circuit is connected to the output of the D/A converter and a steering voltage is held at the circuit.

The sample hold circuit includes a capacitor which may be the same capacitor which is an element of the loop filter.

A variable bandwidth filter may be connected to an output of the D/A converter, and the oscillation frequency switching means may include a bandwidth controlling means which narrows the bandwidth of the variable bandwidth filter after switching the oscillation frequency. Separately from the above, a variable bandwidth filter is connected to an output of the voltage controlled oscillator, and the oscillation frequency means may include a bandwidth controlling means which narrows the bandwidth of the filter after switching the oscillation frequency.

The output of the D/A converter may be connected to a low-pass filter to include a means which sequentially sets plural different voltages before the steering voltage corresponding to the frequency after the switching is set at the output of the D/A converter.

According to the first aspect of this invention the frequency errors can be reduced effectively, and phase errors can be absorbed according to the second aspect thereof.

As the steering voltage is generated in a manner not to vary the output voltage of the loop filter in the first aspect of this invention, and the variable ratio divider is reset at the time of frequency switching in the second aspect thereof, the phase errors which might be caused otherwise at the switching can be reduced.

Accordingly, due to the advantages achieved by the first and the second aspects of this invention the time necessary to switch frequency can be shortened.

When a variable bandwidth filter is used, the bandwidth should be set wider at the time of switching oscillation frequency, and narrower after settling. This enables the supply of steering voltage with a quick rise at the time of switching, and after the oscillation frequency changes, prevents the noise of the D/A converter provided within the voltage supply means from being transmitted to the voltage controlled oscillator.

The same effect may be obtained by separating the D/A converter from the phase-locked loop after frequency switching. In this case, the capacitor of the loop filter is used as the sample hold circuit.

In other words, the digital-analog converter which deteriorates noise characteristics of the voltage controlled oscillator is separated from the phase locked loop except during the time of frequency switching. This enables frequency switching at a higher speed and prevents deterioration in noise characteristics of the voltage controlled oscillator at static state.

The frequency synthesizer of the type is most effective when applied to radio communication systems which switch plural radio channels. Such system is required to search vacant channels at a high speed or switch radio channels without interrupting the communication. By using the frequency synthesizer of this invention as a local oscillator for such radio communication systems, stable locally oscillated frequency may be obtained, and radio channels may be switched at high speed. Moreover, as this allows vacant channel search and non-interrupted channel switching without difficulties, it is highly effective to enhance functions and the performance of the systems.

BRIEF DESCRIPTION OF THE DRAWINGS

These and other aspects of the invention will now be described in detail with reference to the accompanying drawings, wherein.

DETAILED DESCRIPTION OF THE PREFERRED EMBODIMENT

Figure 3:
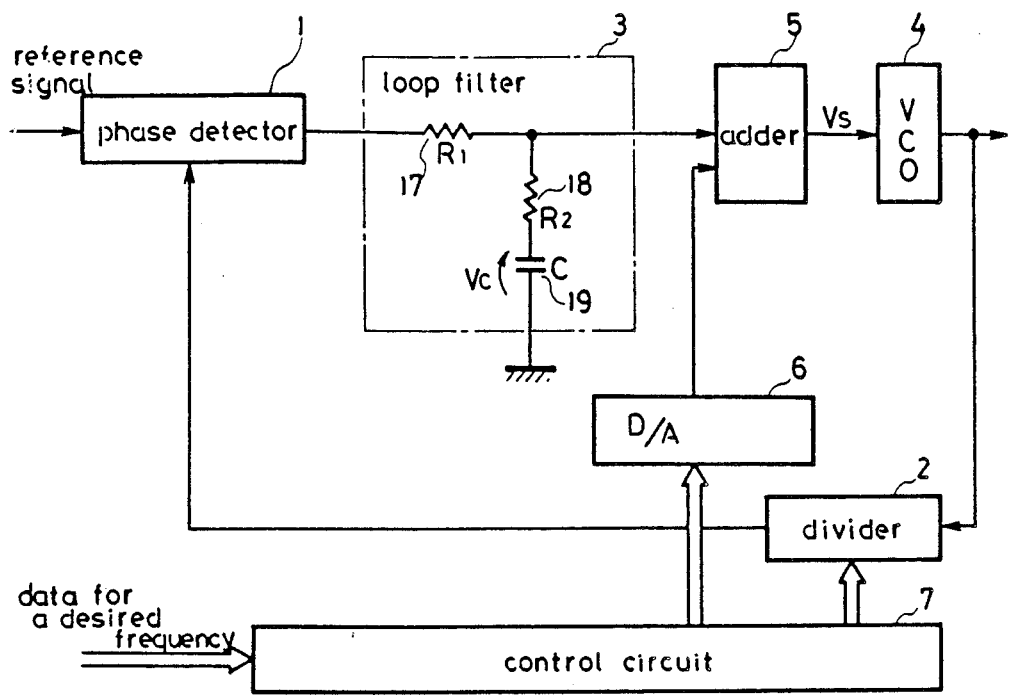
FIG. 3 is a block diagram of another conventional frequency synthesizer.
Figure 4:
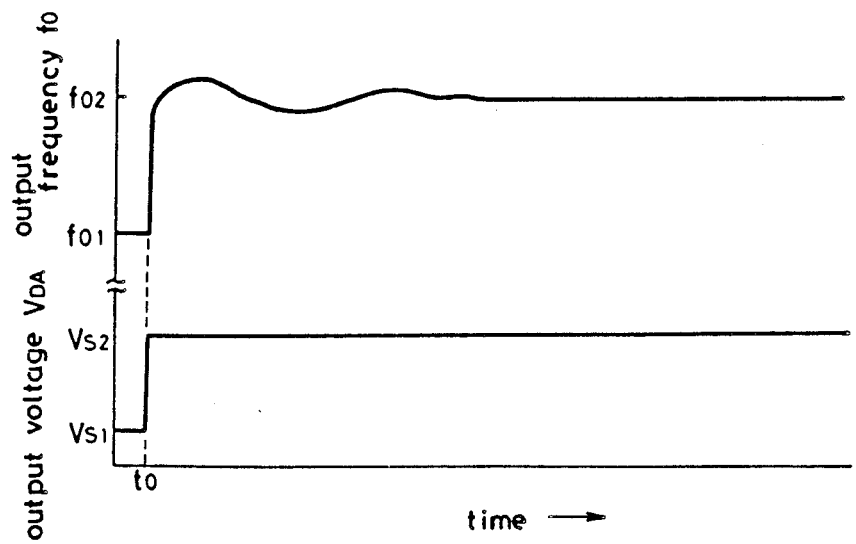
FIG. 4 is a graph to show variations in output frequency of the voltage controlled oscillator in relation to the changes in output voltage from a D/A converter.
Figure 5:
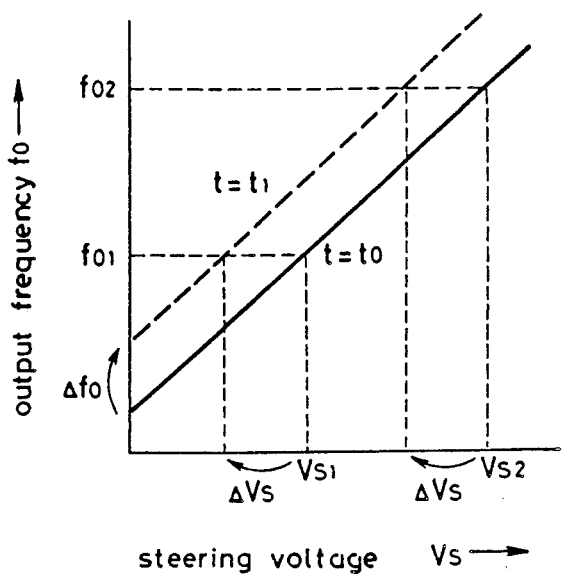
FIG. 5 is a graph to show an example of characteristics of the output frequency in relation to the steering voltage of the voltage controlled oscillator.
Figure 6:
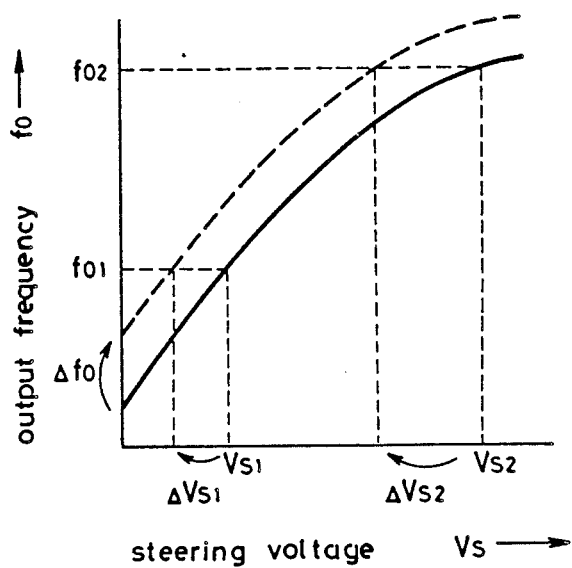
FIG. 6 is a graph to show another example of the characteristics of the output frequency in relation to the steering voltage of the voltage controlled oscillator.
Figure 7:
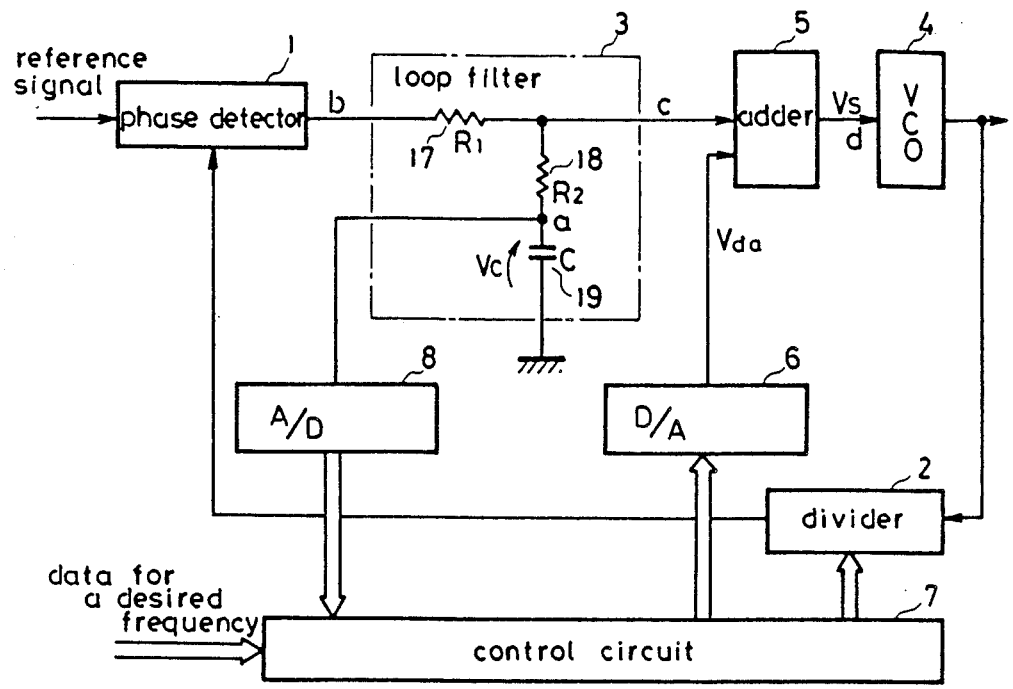
FIG. 7 is a block diagram to show the first embodiment of the frequency synthesizer according to this invention.

FIG. 7 is a block diagram to show the first embodiment of a frequency synthesizer according to this invention. The embodiment differs from the prior art shown in FIG. 3 as described below. The voltage $V_c$ of the capacitor 19 is sampled by an A/D converter 8 and the data thereof is supplied to a control circuit 7. Errors in the set voltage which have occurred in the prior art can be avoided by this construction. For instance, when the steering voltage against output frequency characteristics are not linear, as shown in the VCO characteristics in FIG. 6, the drift compensation voltage $\Delta V_s$ corresponding to the frequency drift $\Delta f_0$ is different between the steering voltages $V_{s1}$ and $V_{s2}$ as indicated in the voltages $\Delta V_{s1}$ and $\Delta V_{s2}$. Therefore, at the time of frequency switching, the frequency drift $\Delta f_0$ is obtained from the values of the drift compensation voltage $\Delta V_{s1}$ in advance, a value of drift compensation voltage $\Delta V_{s2}$ is assumed from the frequency drift $\Delta f_0$ and set to the value $V_{s2}-(\Delta V_{s2}-\Delta V_{s1})$ at the D/A converter 6.

At steady state, the drift compensation voltage $\Delta V_{s1}$ becomes equal to the voltage of the capacitor, which is sampled by the A/D converter 8. As the frequency drift $\Delta f_0$ is extremely small, it is obtainable from the VCO gain in the steering voltage $V_{s1}$ and the drift compensating voltage $\Delta V_{s2}$. The voltage drift $\Delta V_{s2}$ may be assumed from the frequency drift $\Delta f_0$ and the VCO gain of the steering voltage $V_{s2}$.

As described above, by setting the output of the D/A converter Vda corresponding to the output frequency $f_{02}$ as $V_{s2}-(\Delta V_{s2}-\Delta V_{s1})$ and adding the same to an adder 5 at the same time as the division ratio is changed, the frequency can be switched without changing the voltage of the capacitor.

Figure 15:
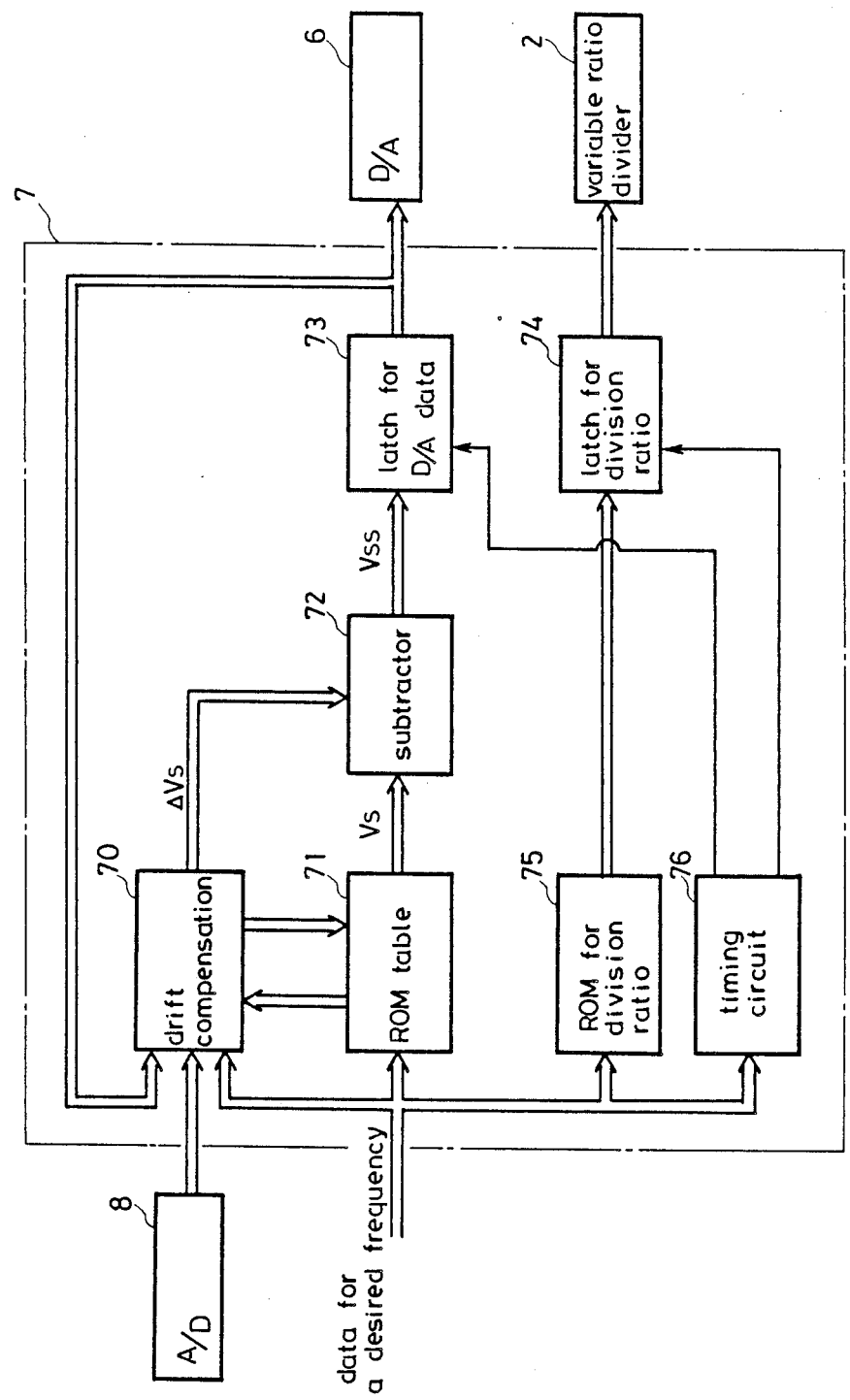
FIG. 15 is a block diagram to show an embodiment of the internal construction of a control circuit.

FIG. 15 is a block diagram to show the internal construction of such control circuit 7. A ROM table 71 stores a correspondence between steering voltage vs. VCO output frequency characteristics before the drift, shown in solid lines in FIG. 6. The table receives input of desired frequency data, and outputs steering voltage data $V_s$ corresponding thereto. A drift compensation circuit 70 calculates a frequency drift $\Delta V_{s1}$ from the output of the Vda supplied to the D/A converter 6 and the $V_c$ data which is an output from the A/D converter 8, and stores the result. Drift compensation circuit 70 also obtains the voltage drift $\Delta V_{s2}$ corresponding to the frequency $f_{02}$ by referring to the table when the desired frequency data is shifted from $f_{01}$ to $f_{02}$, and outputs the drift compensation voltage $\Delta V_s = \Delta V_{s2} - \Delta V_{s1}$. A subtractor 72 supplies steering voltage $V_{ss} = V_{s2} - (\Delta V_{s2} - \Delta V_{s1})$ to latch for D/A data 73. ROM table 71 supplies the voltage $V_{s2}$ corresponding to $f_{02}$. ROM 75 stores a correspondence table for division ratios and receives as input a desired frequency data and supplies a division ratio data corresponding thereto to a latch for division ratio 74. When switching the desired frequency data from $f_{01}$ to $f_{02}$, a timing circuit 76 supplies latch signals respectively to the latch 73 for D/A data and the latch 74 for division ratio, after completion of arithmetic operation by the subtractor 72. This renews Vda data and the division ratio data.

The frequency switching time can be shortened by the above operation without allowing any errors in steering voltage, even though the VCO characteristics are not linear. In FIG. 7 the input of the A/D converter is connected to a terminal or point a of the capacitor in order to take out the capacitor voltage $V_c$, but the same effect may be achieved by taking out the voltage at the points b, c or d for the A/D converter 8 instead of the point a as the electric current does not flow through the resistors $R_1$ and $R_2$ in the steady state. However, if the voltage is taken out at the point d, the capacitor voltage $V_c$ must be calculated by subtracting the voltage Vda from the value which has been taken out.

In the aforementioned embodiment, a sample hold circuit may be connected to an output of the D/A converter 6 and the steering voltage may be outputted from the sample hold circuit to an adder 4. In this case, the power supply to the D/A converter 6 is stopped after the steering voltage is held at he sample hold circuit. This saves power consumption.

Figure 8:
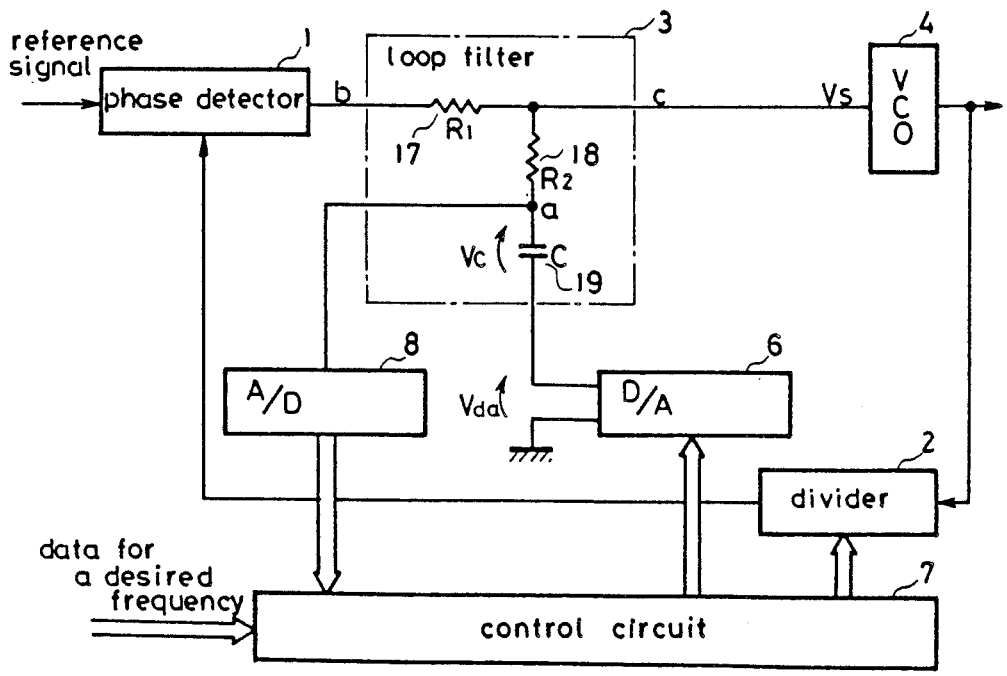
FIG. 8 is a block diagram to show the second embodiment of the frequency synthesizer according to this invention.

FIG. 8 is a block diagram to show the second embodiment of a frequency synthesizer according to this invention. This embodiment differs from the first embodiment shown in FIG. 7 in that the D/A converter 6 is connected in series to the grounding point of the loop filter 3 and the adder is omitted. The VCO steering voltage $V_s$ may be expressed similarly to the equation (2) as $V_s = V_c + Vda$ if the voltage of the capacitor is denoted as $V_c$, and the output of the D/A converter as Vda. In this embodiment, $V_c + Vda$ is taken out from the A/D converter 8 and drift compensation voltage $\Delta V_s (= V_c)$ may be obtained by subtracting the voltage Vda from the taken out value. Then, frequency drift $\Delta f_0$ is calculated by a manner similar to that of the first embodiment, and a D/A converter output data suitable to the output frequency $f_{02}$ which is to be outputted next is set. The effects obtained are similar to the first embodiment and the circuit structure may be simplified. As no electric current flows through the resistors $R_1$ and $R_2$ at the static time, the voltage may be taken out at the point b or c instead of the point a by using the A/D converter 8 to attain the same effect.

Figure 9:
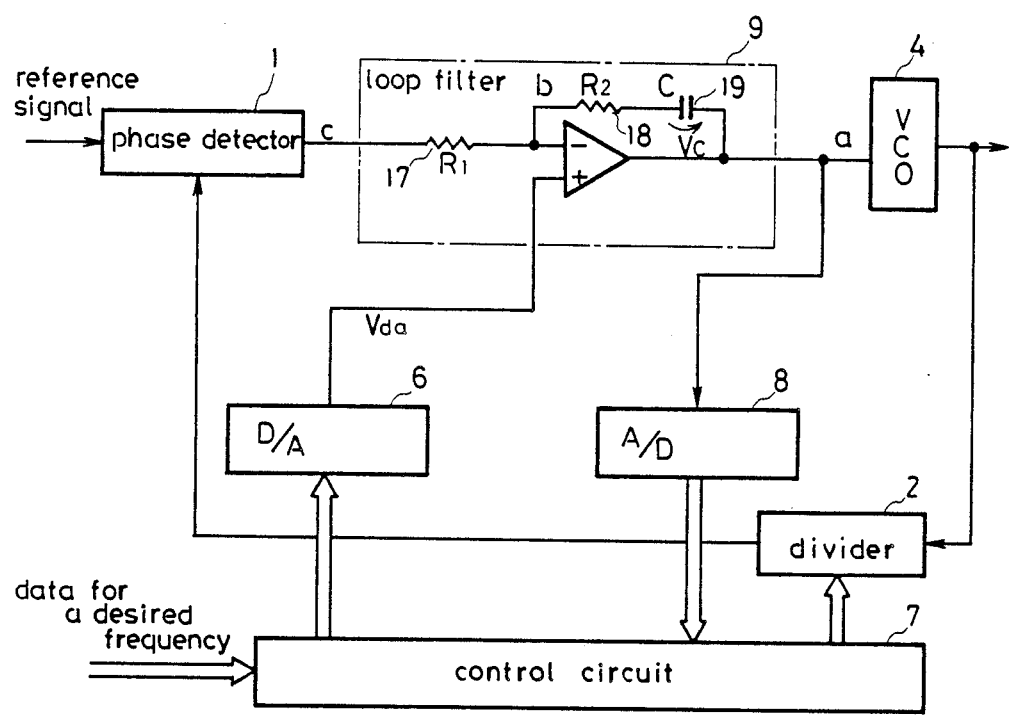
FIG. 9 is a block diagram to show the third embodiment of the frequency synthesizer according to this invention.

FIG. 9 is a block diagram to show the third embodiment of the frequency synthesizer according to this invention. This embodiment differs from the first embodiment shown in FIG. 7 in that the loop filter 9 includes an operational amplifier therein, and the D/A converter output (Vda) is supplied to a non-inverting input of the operational amplifier which is a signal grounding point of the loop filter 9, and the A/D converter 8 is connected to the output of the loop filter.

The steering voltage $V_s$ of VCO 4 may be expressed as $V_s = V_c + Vda$ similarly to the formula (2) if the voltage of a capacitor is represented as $V_c$ and the output of D/A converter Vda. As no electric current flows through the resistors $R_1$ and $R_2$ in the static state, $V_c + Vda$ may be obtained from the output of the loop filter. Therefore, an effect similar to that of the second embodiment shown in FIG. 7 may be obtained by subtracting the voltage Vda from $V_c + Vda$ and calculating $\Delta V_s (= V_c)$.

Figure 10:
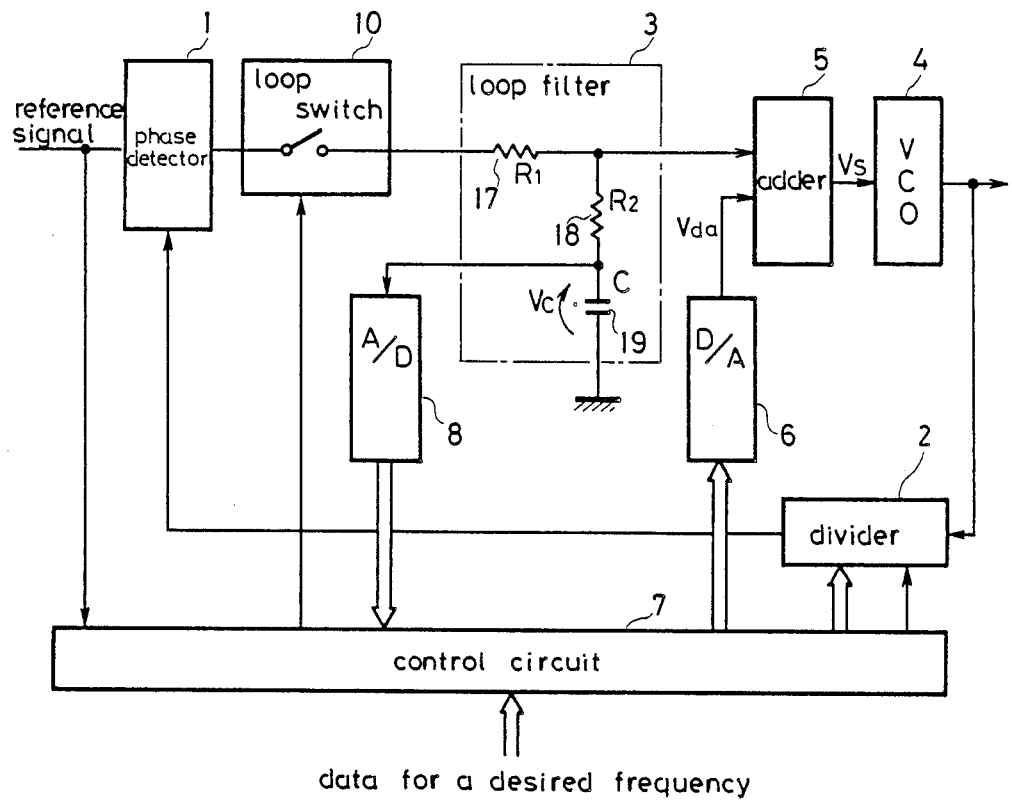
FIG. 10 is a block diagram to show the fourth embodiment of the frequency synthesizer according to this invention.

FIG. 10 is a block diagram to show the fourth embodiment of the frequency synthesizer of this invention. Japanese Patent Application Sho 61-305253 has proposed a method to suppress frequency fluctuation caused by phase errors when a PLL is operated intermittently. The operation of the proposed method is applied to reduce the phase errors at the frequency switching herein. This embodiment differs from the first embodiment of FIG. 7 in that the reference signal is inputted in the control circuit 7 as a trigger signal and the reset signal is sent to the variable ratio divider 2.

Figure 11:
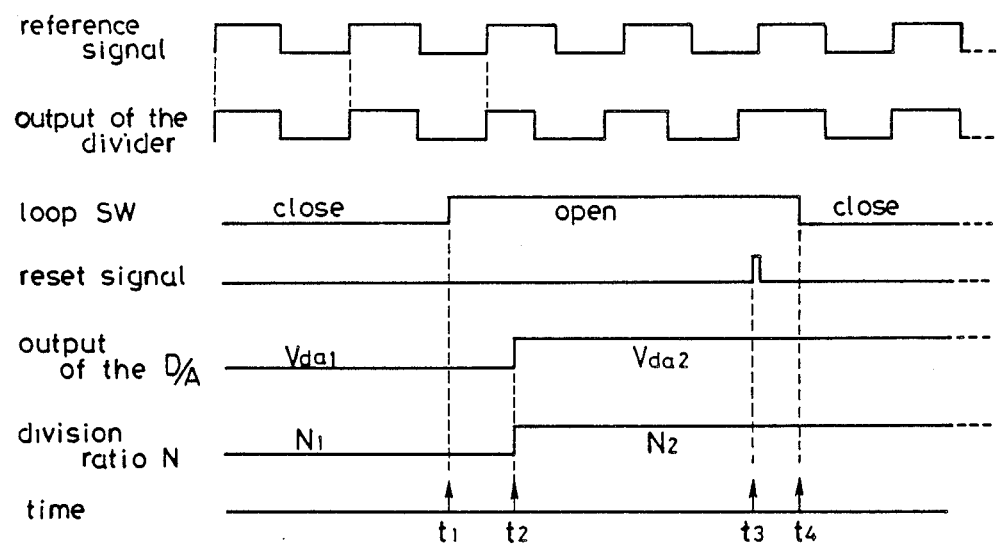
FIG. 11 is a time chart showing synchronization.

FIG. 11 is a chart to show the timing of frequency switching wherein the loop switch 10 is turned OFF to open the loop at the time $t_1$. The output voltage of the D/A converter 6 is turned from Vda1 to Vda2, and the division ratio is switched from $N_1$ to $N_2$. The steering voltage of VCO 4 is set at a level corresponding to the target frequency at this stage. The reference signal phase may be different from the phase of the variable ratio divider as shown in FIG. 11. If the loop switch 10 is turned ON as it is, the phase error may cause fluctuation in output frequency. In order to inhibit the fluctuation, a reset signal is sent out to the variable ratio divider 2 at the time $t_3$. The timing for the reset signal is determined by triggering the reference signal. This locks the phase of the variable ratio divider with the phase of the output from the reference signal, and if the loop switch 10 is turned ON at the time $t_4$, drifts will not be caused in output frequency due to phase errors. The steering voltage data to be set at the D/A converter 6 is calculated by a method similar to the one shown and described with reference to FIG. 7. This operation can reduce both the steering voltage error and the phase error at the time of frequency switching.

The chart of FIG. 11 shows a case where the counting of divider 2 is re-started at the end of the reset signal which is synchronized with the positive edge of reference signal. The counting of the divider may re-start at the end of a reset signal which is synchronized with the negative edge of reference signal.

Figure 16:
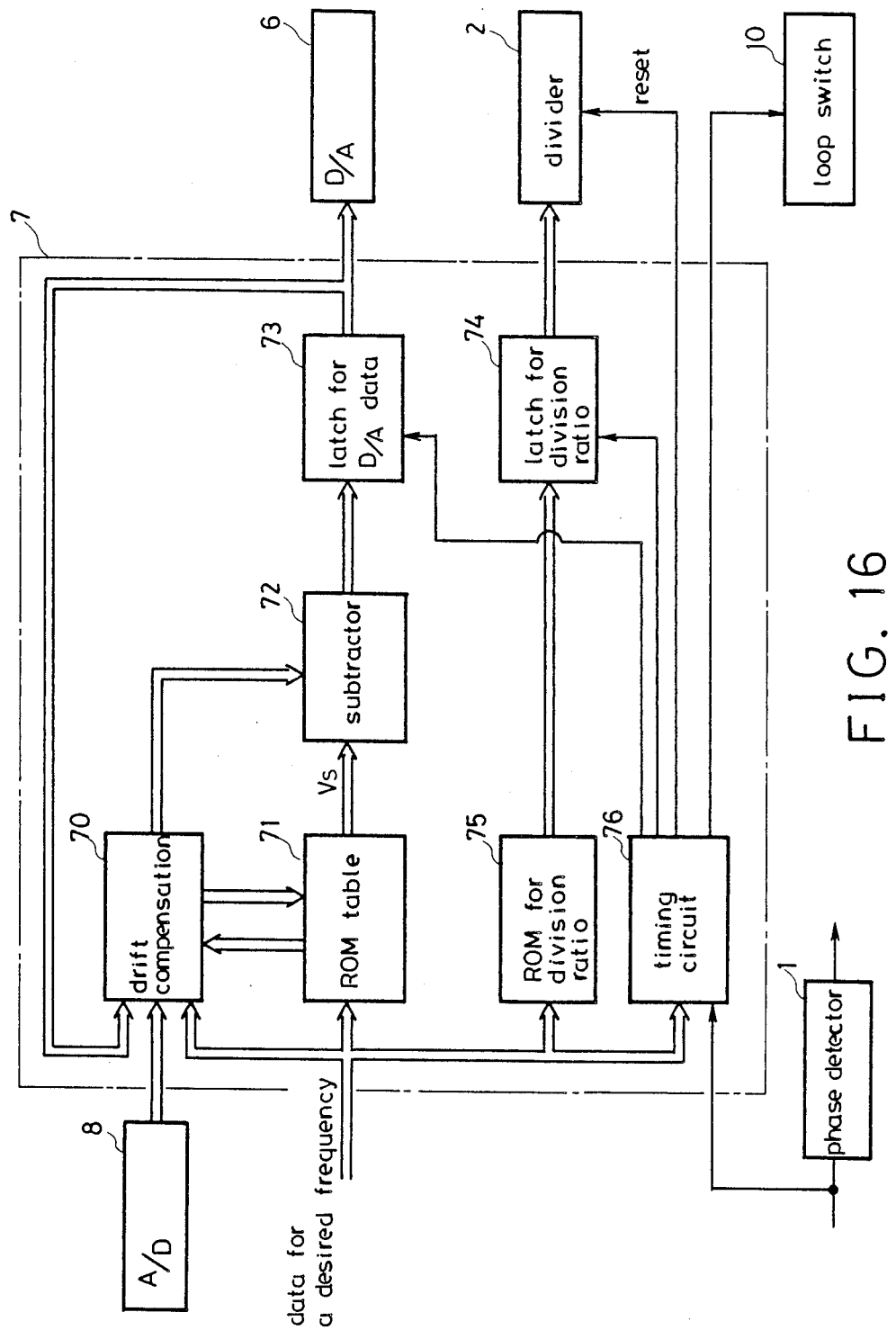
FIG. 16 is a block diagram to show another embodiment of the internal construction of the control circuit.

FIG. 16 is a block diagram to show the inside of a control circuit 7 which differs from the structure shown in FIG. 15 by the inclusion of a timing circuit 76. The timing circuit 76 receives the reference signal as a trigger, and outputs a reset signal for the variable ratio divider 2 and the loop switch signal in accordance with the aforementioned timing. These signals are executed in order such as "receiving desired frequency data, turning the loop switch OFF, changing Vda and N, sending reset signal, and turning the loop switch ON".

Figure 12:
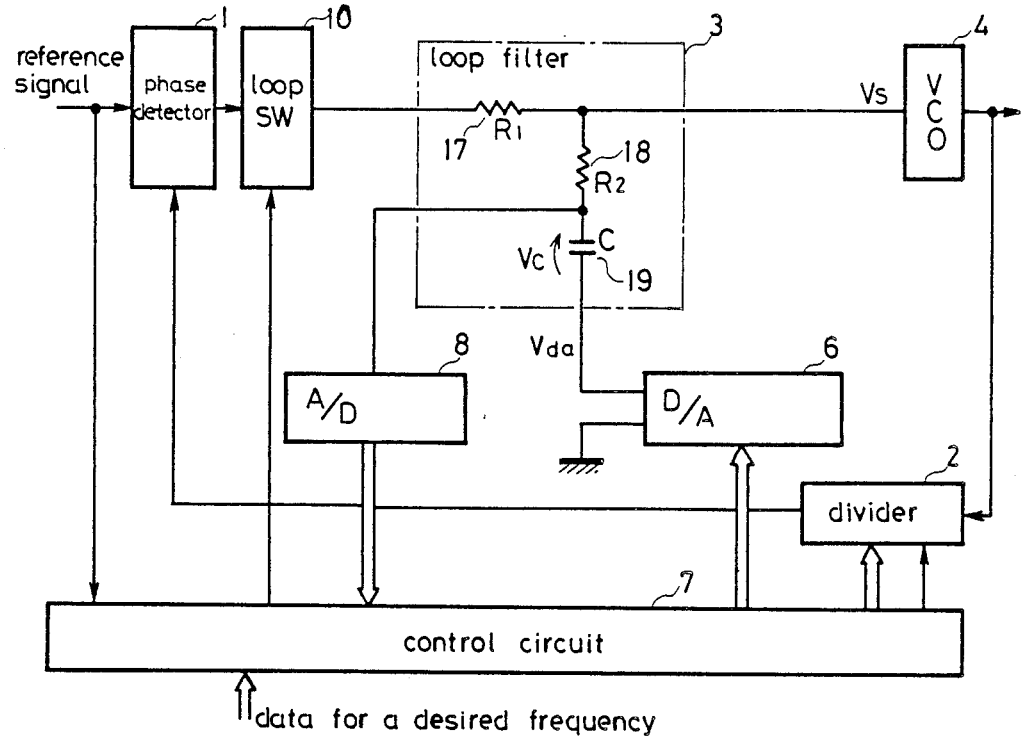
FIG. 12 is a block diagram to show the fifth embodiment of the frequency synthesizer according to this invention.

FIG. 12 is a block diagram of the fifth embodiment of the frequency synthesizer according to this invention. This embodiment is a combination of the embodiment shown in FIG. 8 with a reset function of the variable ratio divider 2. The combined functions can reduce both the steering voltage error and phase errors to zero at frequency switching, and thereby an effect similar to that of the embodiment shown in FIG. 10 may be achieved.

Figure 13:
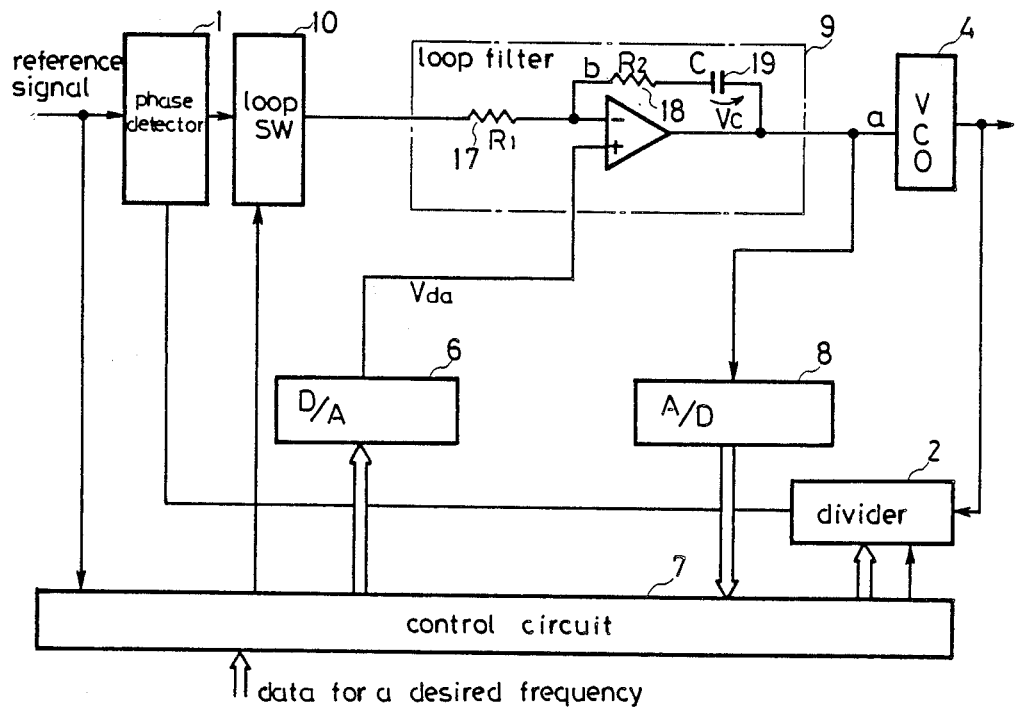
FIG. 13 is a block diagram to show the sixth embodiment of the frequency synthesizer according to this invention.

FIG. 13 is a block diagram to show the sixth embodiment of the frequency synthesizer according to this invention. This embodiment is a combination of the embodiment shown in FIG. 9 with a reset function used for the variable ratio divider in the embodiment shown in FIG. 10. This combination enables reduction of both the steering voltage error and phase errors to zero level at frequency switching to achieve the effect similar to the embodiment shown in FIG. 10.

Figure 14A:
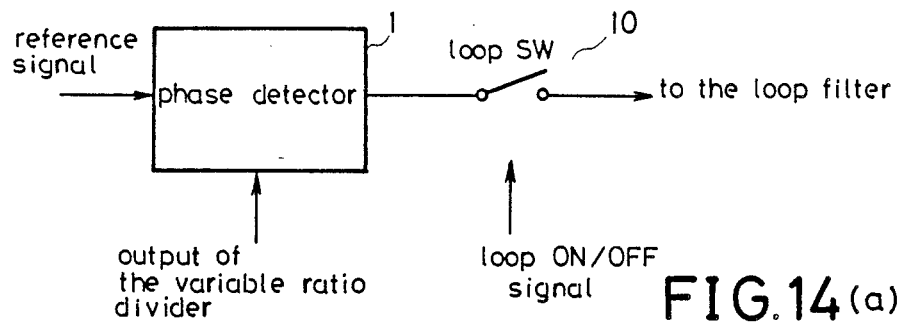
FIGS. 14a-14d are views to show an embodiment of the phase detector which has a loop switching function.
Figure 14B:
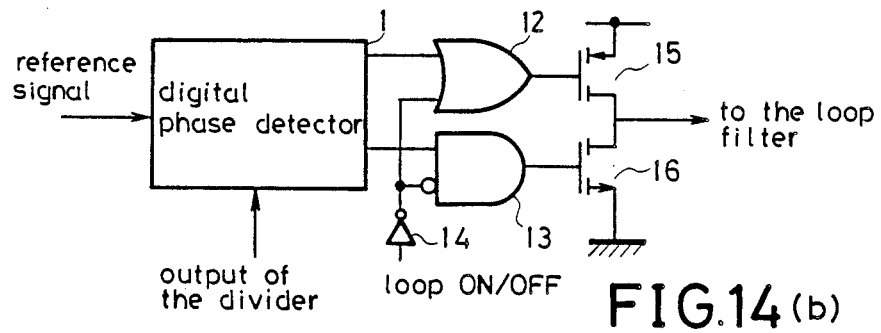
Figure 14C:
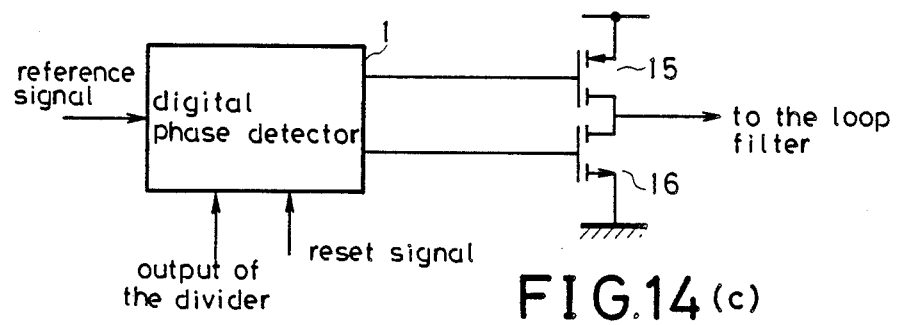
Figure 14D:
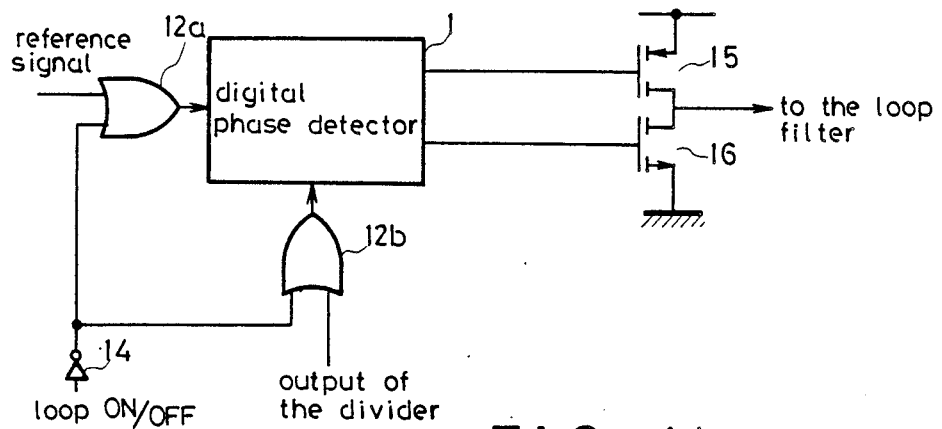

FIGS. 14a–14d show an embodiment of a phase detector having the loop switch function. More particularly, FIG. 14a shows a basic embodiment of the phase detector having the loop switch function which is used in the embodiments shown in FIGS. 10 through 13. FET analog switches which can be switched at a high speed may be used as the loop switch shown in the figures. FIG. 14b shows an embodiment which realizes close/open connection (ON/OFF) of the phase locked loop by combining a charge pump circuit with an FET analog switch and a logic circuit. In this construction, when "0" is input as the loop ON/OFF signal, the output from an OR gate 12 becomes "1" despite the logical output from the digital phase detector 1. P channel FET 15 which uses the output from the OR gate 12 input and an N channel FET 16 which uses the output from an AND gate 13 are opened while the phase locked loop is open. When the loop ON/OFF signal "1" is inputted, the gates of both FETs 15 and 16 are driven with the output of the digital phase detector, and the phase locked loop is closed. FIG. 14c shows a loop switch which opens the FET when the digital phase detector 1 is reset. FIG. 14d shows that the loop is opened by holding the input of the circuit 1 with OR gates 12a and 12b so that the logical output from the circuit 1 becomes the same state as the phase locked loop to open FETs 15 and 16.

In the above embodiments, the output from the D/A converter 6 is used as the steering voltage as it is; however, if noise is included within the output from the D/A converter 6, the noise is directly added to the steering voltage. The phase noise in the VCO output increases consequently.

The following embodiments attempt to solve these problems. They can prevent phase noise increase which is caused by the addition of the control circuit 7 and D/A converter 6. In the description of the following embodiments, the description on the construction to correct non-linearity of the oscillator 4, and structure for resetting the variable ratio divider and the loop switch will be omitted unless specifically required.

Figure 17:
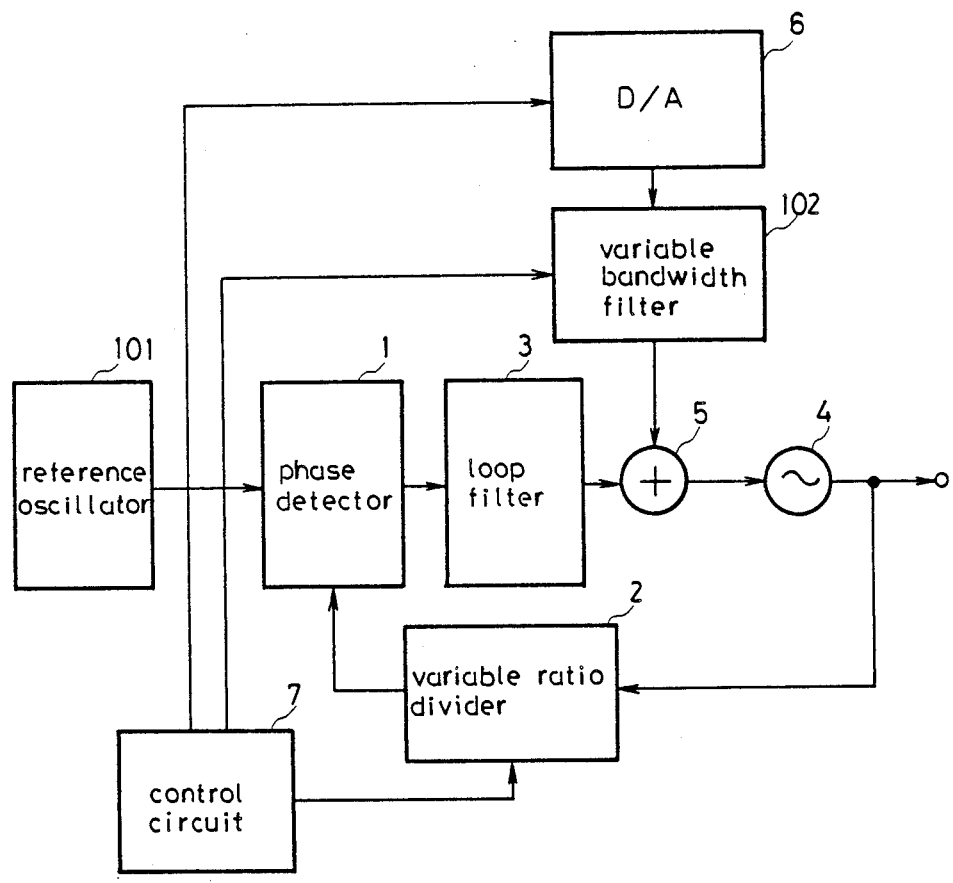
FIG. 17 is a block diagram to show the seventh embodiment of the frequency synthesizer according to this invention.

FIG. 17 is a block diagram to show the seventh embodiment of the frequency synthesizer according to this invention.

The frequency synthesizer comprises a voltage controlled oscillator 4, a variable ratio divider which divides the output from the oscillator 4, a phase detector 1 which compares the phase of the output from the divider 2 with the phase of the reference signal, a loop filter 3 which smooths the output from the detector 1 and supplies the same to the oscillator 4, and an oscillation frequency switching means which controls the oscillation frequency of the oscillator 4 by switching the division ratio of the divider 2. The oscillation frequency switching means includes a control circuit 7, a digital-/analog converter 6 which is a voltage supply means which supplies a steering voltage corresponding to the frequency after switching to the oscillator 4 when the division ratio of the divider 2 is switched to vary the oscillation frequency at a high speed, a variable bandwidth filter 102 which is connected to the output of the digital to analog converter 6 and an adder 5 which adds the output of the variable bandwidth filter 102 with the output from the loop filter 3.

Although the frequency synthesizer includes the circuits shown in relation to the first to the sixth embodiments, the description thereof is omitted.

This embodiment is characterized in that the voltage supply means includes a variable bandwidth filter 102, and the control circuit 7 includes a bandwidth limiting means which sets the bandwidth of the filter 102 to be narrower after the frequency switching.

The variable bandwidth filter 102 connected to the output side of the D/A converter 6 is controlled to have a narrow bandwidth in the steady state, and therefore does not transmit the noise generated in the converter 6 to the voltage controlled oscillator 4. The bandwidth at this time is denoted as $W_2$.

Description will be given for the case where the frequency is switched from $F_1$ to $F_2$. The frequency is switched by concurrently conducting changing division ratio of the divider 2, changing of input data of the D/A converter 6 and changing of the bandwidth of the filter 102. These changes are controlled by the control circuit 7.

Concurrently to the data change and division ratio change, the bandwidth of the variable bandwidth filter 102 is shifted from bandwidth $W_2$ to bandwidth $W_1$ which is wider than $W_2$. By these procedures, the output voltage of the D/A converter 6 is transmitted to the adder 5 at high speed so that the steering voltage of the oscillator 4 is rapidly changed to $V_2$, thus enabling high speed frequency switching.

After frequency switching, the bandwidth of the filter 102 is reset at $W_2$ again. This enables to suppress the noise generated by the D/A converter 6 and prevent increase in phase noise characteristics in the output of the oscillator 4.

Therefore, without deteriorating the noise characteristics of the oscillator 4, the frequency can be rapidly switched.

Figures 18, 19:
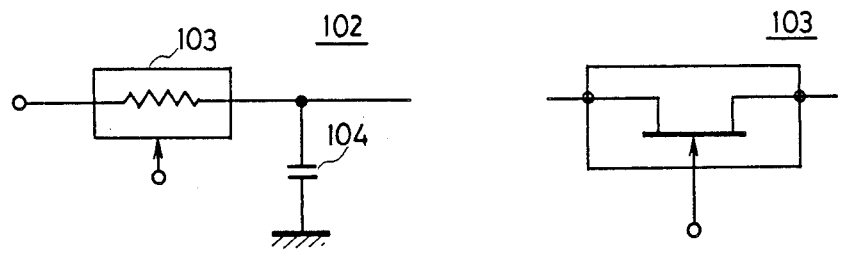
FIG. 18 is a circuit diagram to show an embodiment of a variable bandwidth filter.
FIG. 19 is a circuit diagram to show an embodiment of a voltage controlled resistor.

FIG. 18 shows an embodiment of the variable bandwidth filter. The filter 102 comprises a voltage controlled resistor 103 which has a resistance that is changed by the controlling voltage and a capacitor 104.

FIG. 19 shows an embodiment of the voltage controlled resistor 103. The resistor 103 uses a field effect transistor (FET) which changes the resistance between its source and drain as a function of the voltage applied to the gate. When the resistance is large, the bandwidth becomes narrow, and when the resistance is low, the bandwidth becomes wider.

Figure 20:
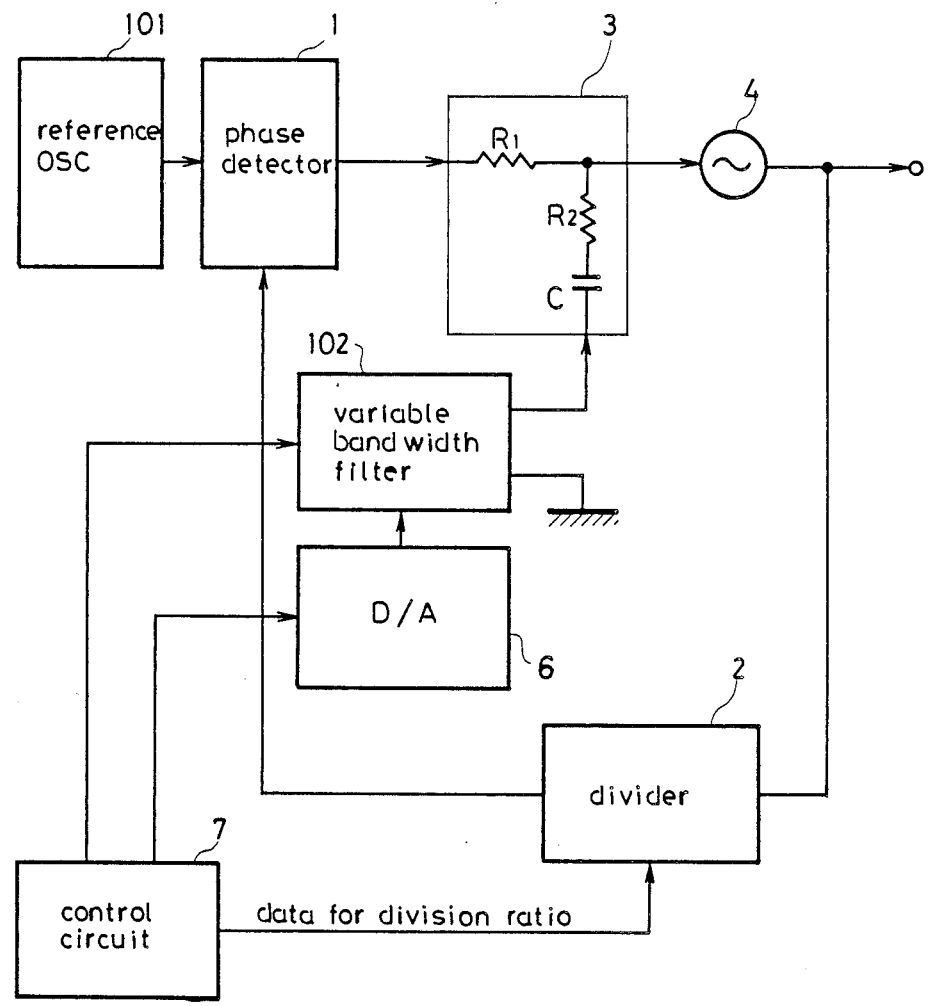
FIG. 20 is a block diagram to show the eighth embodiment of the frequency synthesizer according to this invention.

FIG. 20 is a block diagram to show the eighth embodiment of the frequency synthesizer according to this invention.

This embodiment differs from the seventh embodiment in that the output of the variable bandwidth filter 102 is directly connected to the loop filter 3 in order to add the voltages of the filter 102 and of the loop filter 3. However, the operation thereof is identical to that of the seventh embodiment.

Figure 21:
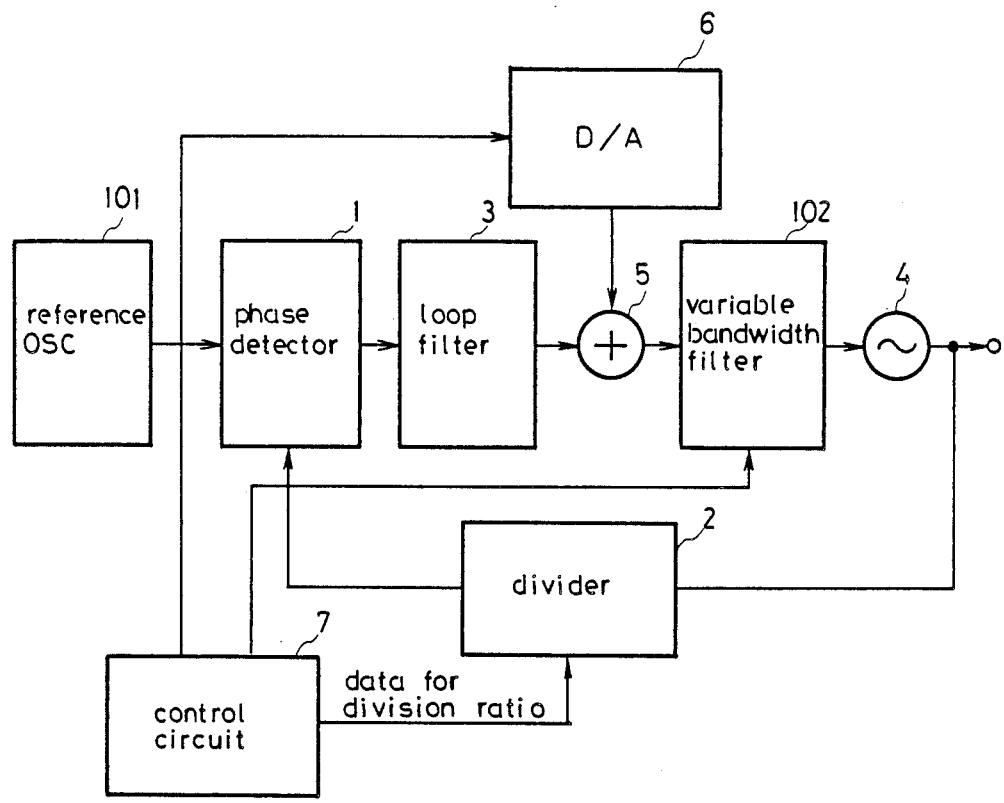
FIG. 21 is a block diagram to show the ninth embodiment of the frequency synthesizer according to this invention.

FIG. 21 is a block diagram to show the ninth embodiment of the frequency synthesizer according to this invention.

This embodiment differs from the seventh embodiment in that the variable bandwidth filter 102 is connected between the adder 5 and the voltage controlled oscillator 4, but the operation thereof is identical to that of the seventh embodiment. The bandwidth of the filter 102 is varied at the time of frequency switching in this embodiment. This enables high speed frequency switching without deteriorating the noise characteristics of the oscillator 4.

Figure 22:
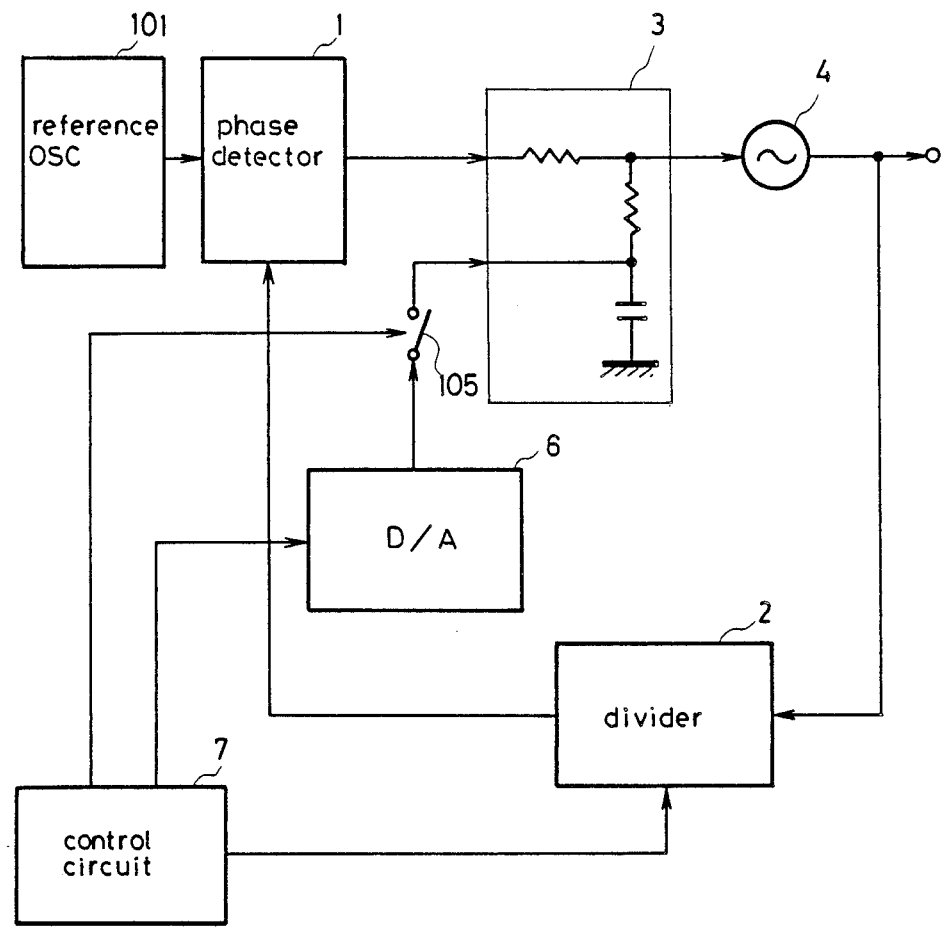
FIG. 22 is a block diagram to show the tenth embodiment of the frequency synthesizer according to this invention.

FIG. 22 is a block diagram to show the tenth embodiment of the frequency synthesizer according to this invention.

In this embodiment the D/A converter 6 is connected to a capacitor in the loop filter 3, and a switch 105 is provided between the D/A converter 6 and the capacitor as a means to disconnect the D/A converter 6 after the steering voltage from the converter 6 is held in the capacitor.

The switch 105 is opened by the control circuit 7 in the steady state to disconnect the D/A converter 6 from the loop filter 3. The phase locked loop operates ordinarily in this stage, and the VCO output signal with a stability similar to the output signal from the reference oscillator 101 is obtained from the oscillator 4 at a frequency corresponding to the division ratio N set at the variable ratio divider 2.

Description is now given of the case where the frequency $F_1$ is switched to the frequency $F_2$.

Before switching, the output voltage of the D/A converter 6 is set to V which is a control voltage of the oscillator for the frequency F. Then, the division ratio $N_2$ is set by the control circuit 7 at the divider 2 in correspondence to the frequency F to which the frequency is going to be switched, and at the same time, the switch 105 is closed to apply the output voltage $V_2$ of the digital analog converter 6 to the capacitor in the loop filter 3. This makes the capacitor charge rapidly, and the frequency of the oscillator 4 is rapidly switched to the frequency $F_2$. Then, the switch 105 is opened after the completion of charging of the capacitor, so as to cut off the output from the converter 6 from the loop filter 3.

The output from the D/A converter 6 is directly connected to the capacitor of the loop filter 3 via the switch 105. If the output impedance of the D/A converter 6 is sufficiently low, the capacitor can be charged at an extremely high speed. As the D/A converter 6 is disconnected from the loop filter 3 after completion of charging, noise generated from the D/A converter 6 is also blocked without influencing the VCO steering voltage. Therefore, the frequency can be switched at a high speed without deteriorating the noise characteristics of the oscillated signals. The switch 105 may be a variable resistor as it is a circuit to disconnect the signal from the D/A converter 6.

Figure 23:
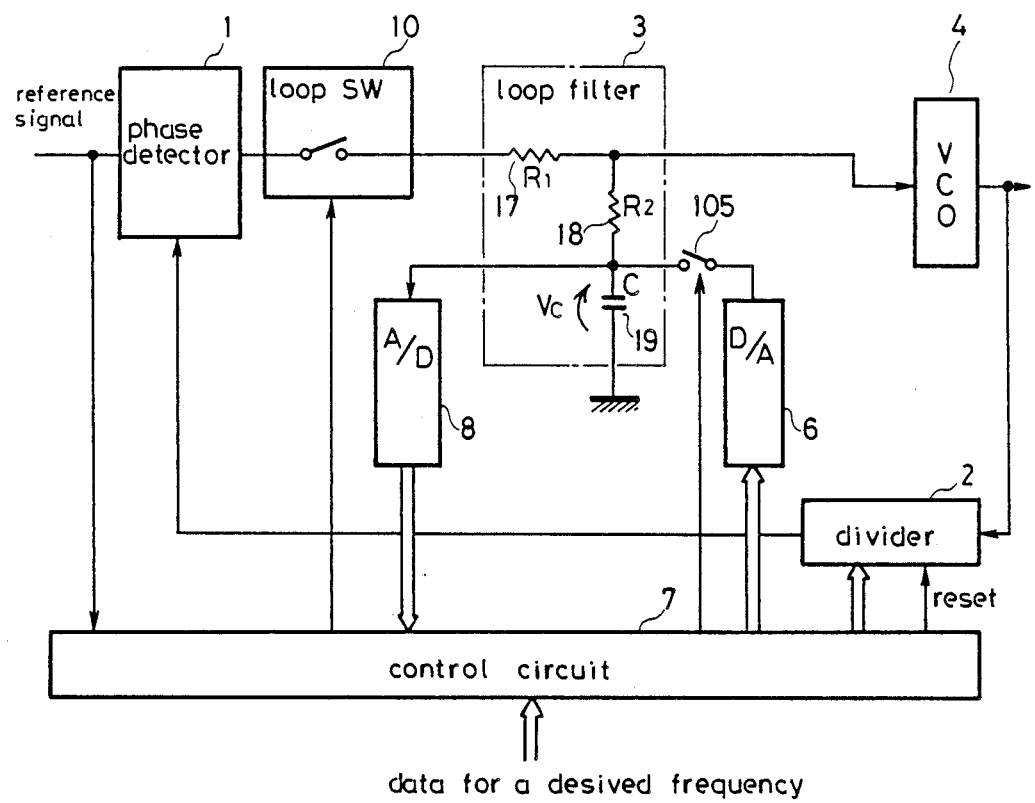
FIG. 23 is a block diagram to show the details of the tenth embodiment.

FIG. 23 is a block diagram to show a variation of the tenth embodiment. In this embodiment of the frequency synthesizer, similar to the fourth embodiment shown in FIG. 10, the frequency can be switched at a high speed.

Moreover, this enables suppression of the noise generated by D/A converter 6 to prevent increase in phase noise characteristics in the output of the oscillator.

The variable ratio divider 2 is a divider with a reset means, and the control circuit 7 resets the divider 2 using the reference signal inputted at the detector as a trigger.

Figure 24:
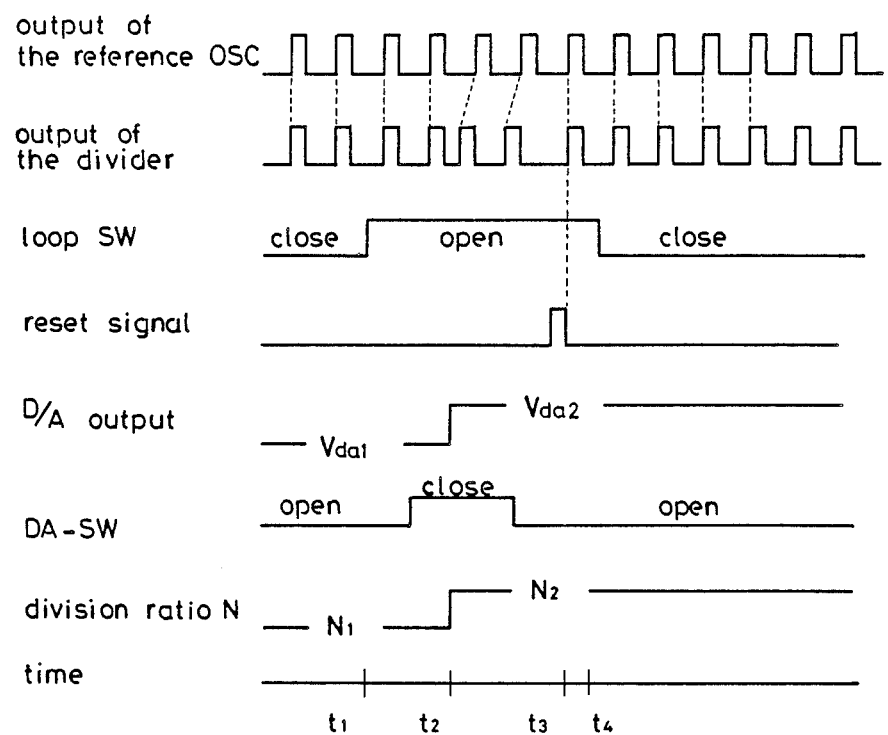
FIG. 24 is a chart to show timings at frequency switching.

FIG. 24 is a timing chart to show the timing of frequency switching in FIG. 23 wherein all the timings except for that of the signal controlling the switch 105 are the same as those shown in FIG. 11. In this chart, the counting of divider 2 restarts at the end of the reset signal which is synchronized with the positive edge of reference signal.

In the seventh to the tenth embodiments, a variable bandwidth filter or a switch is connected to the output of the D/A converter in order to effect both suppression of output noise from the converter and to allow rapid setting of voltages. The construction may be one where the bandwidth of the filter connected to the output of the D/A converter is fixed to achieve a high speed in voltage setting, which will be explained below.

Figure 25:
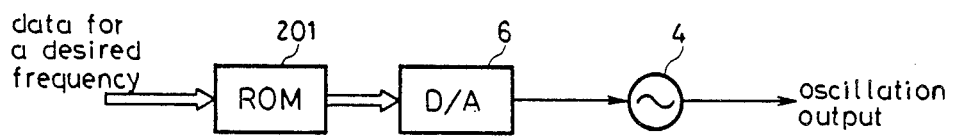
FIG. 25 is a block diagram to show a voltage controlled oscillator and the circuit construction for controlling it.
Figure 26:
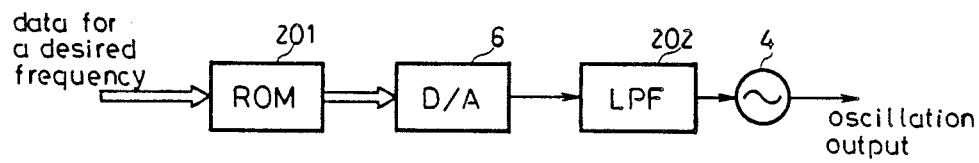
FIG. 26 is a block diagram to show another voltage controlled oscillator and a circuit construction for controlling it.

FIGS. 25 and 26 show circuit structures of the voltage controlled oscillator and a circuit for controlling it. The VCO control circuit comprises a ROM 201 and a D/A converter 6 in the circuit 7 so that the voltage outputted from the D/A converter 6 is connected either directly (FIG. 25) or via a low-pass filter 202 (FIG. 26).

In the circuit shown in FIG. 25, the ROM 201 receives desired frequency data as an input from outside and supplies frequency control voltage data corresponding to the desired frequency. This makes frequency control voltage supplied to the VCO 4 corresponding to the desired frequency. The time necessary to switch frequency becomes equal to the voltage settling time of the D/A converter 6, which can be set to the order of microseconds or faster if a sophisticated D/A converter is used.

However, as the output of the D/A converter 6 contains the noise voltage, the phase-noise characteristic of the output from VCO 4 may deteriorate. As the noise component in the output from the D/A converter 6 is mostly white noise, as shown in FIG. 26, a low-pass filter 202 is connected to the output of the converter 6. This suppresses the phase noise, but the frequency switching time becomes longer.

Figure 27A:
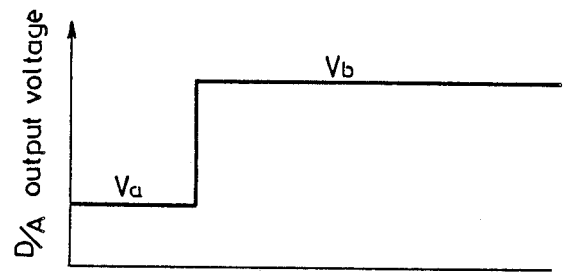
FIGS. 27a and 27b are graphs to show transient behavior of the VCO controlled circuit of FIG. 25 at the time of frequency switching.
Figure 27B:
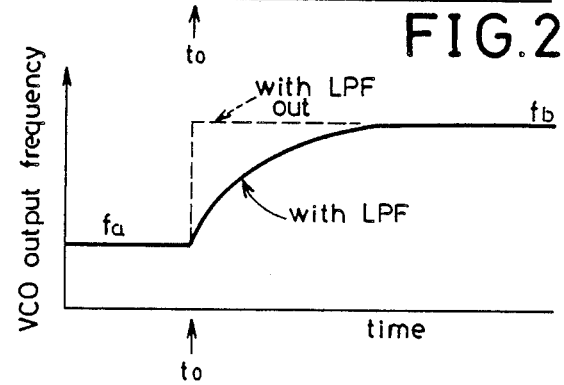

FIGS. 27a and 27b show transient behavior characteristics of the VCO circuit shown in FIGS. 25 and 26, wherein the frequency is switched from $f_a$ to $f_b$. The voltages $V_a$ and $V_b$ are frequency control voltages respectively corresponding to the frequencies $f_a$, and $f_b$. FIGS. 27a and 27b show a case where the output voltage from the D/A converter 6 is switched from $V_a$ to $V_b$ stepwise at the time $t_0$. As illustrated in the figures, when a low-pass filter 202 is inserted, frequency control voltage changes gradually in contrast to the output voltage from the D/A converter 6 which rapidly changes.

In order to eliminate such inconvenience, the bandwidth of the low-pass filter 202 is made variable in the seventh to tenth embodiments. Another approach will be shown below.

Figure 28:
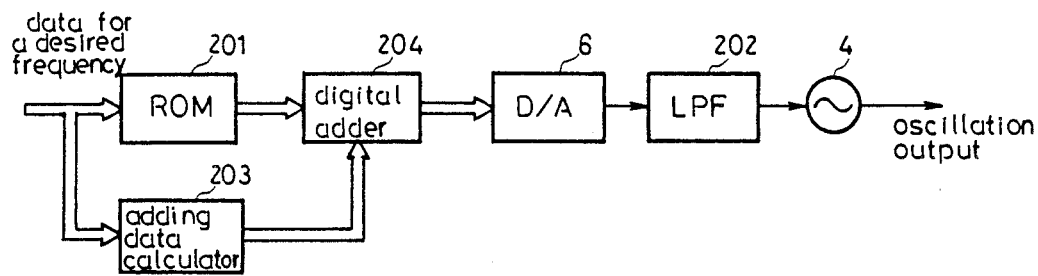
FIG. 28 is a block diagram to show the first embodiment of the VCO controlling circuit.

FIG. 28 is a block diagram to show the first embodiment of a VCO control circuit. The VCO control circuit comprises a ROM 201, an adding data circuit 203, a digital adder 204, and a D/A converter 6. The output from the D/A converter 6 is supplied to the VCO 4 via the low-pass filter 202.

Figure 29A:
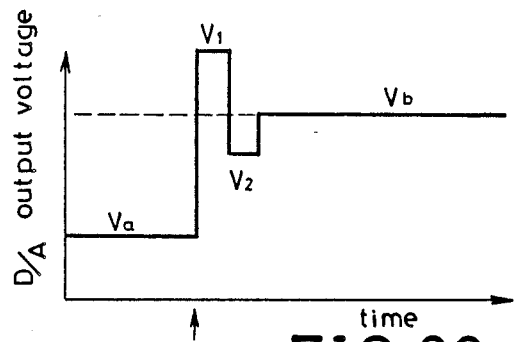
FIG. 29 is a chart to show the waveforms of the output voltage from the D/A converter and the changes in output frequency of the VCO.
Figure 29B:
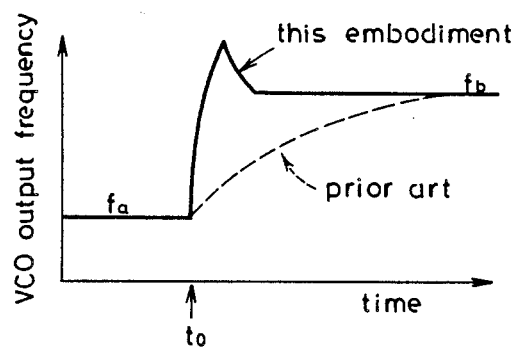

FIGS. 29a and 29b show the changes in the output waveform of the D/A converter 6 and in the output frequency of the VCO 4 when the switching operation starts at the time $t_0$ to switch the frequency from $f_a$ to $f_b$. The voltages $V_a$ and $V_b$ are VCO control voltages respectively in correspondence to the frequencies $f_a$ and $f_b$. As shown in the figure, in the VCO control circuit, the input voltage of the low-pass filter 202 (or the output voltage of the D/A converter 6) changes from the initial voltage $V_a$ to the target voltage $V_b$ via the voltages $V_1$ and $V_2$. The frequency switching time may be shortened by controlling the input voltage of the low-pass filter 202 to reach the target voltage via plural voltages. In this embodiment, adding data corresponding to such plural voltages $V_1$ and $V_2$ may be obtained by the arithmetic operation by the circuit 203 shown in FIG. 28. The adding data produced by the circuit 203 are sequentially sent to the digital adding circuit 204. The above operation can control the output voltage of the D/A converter 6 to change from the initial voltage $V_a$ to the target voltage $V_b$ via plural voltages $V_1$ and $V_2$.

The arithmetic operation of adding data at the circuit 13 will now be described. This arithmetic operation is based on the optimal control theory which uses the state-space method. Description will be given first to the low-pass filter of n-th order. As the simplest example, a first order filter is exemplified.

The state equation and the output equation of n-th order filters are generally expressed as below. (n is an integer)

$$\dot{x}(t) = A^* x(t) + B^* m(t) \quad (3)$$

$$y(t) = D^* y(t) + E^* m(t) \quad (4)$$

wherein
- x(t): state vector (column vector comprising state variables in the number of n)
- $\dot{x}$(t): time derivative of state vector
- A: system matrix (n lines*n columns)
- m(t): input-vector (column vector comprising input vectors in the number of l)
- B: control matrix (l lines*n columns)
- y(t): output-vector (column vector comprising output variables in the number of p)
- D: output matrix (n lines*p columns)
- E: direct path matrix (l lines*p columns)

In the case of filters, the input-vector and the output-vector in the above equations (3) and (4) become single variables respectively. Therefore, the input-vector m(t) corresponds to the input voltage $v_1(t)$ of the filter which is expressed as below.

$$m(t) = v_1(t) \quad (5)$$

The output-vector can be expressed as below because is corresponds to the output voltage $v_0(t)$.

$$y(t) - v_0(t) \quad (6)$$

Equations (3) and (4) are expressions in the time domain, and they will be expressed in s function as below if Laplace-transformed.

$$sX(s) = A^* X(s) + B^* V_1(s) \quad (7)$$

$$V_0(s) = D^* X(s) + E^* V_1(s) \quad (8)$$

wherein X(s), V₁(s) and V₀(s) are respectively expressions of x(t), v(t) and v₀(t) in the s-domain.

The state equations above determine the state transition equation when the sampling time interval is denoted T as below.

$$x((k+1)T) = \Phi(T) \times (kT) + \Psi(T)v_i(kT) \quad (9)$$

k=0, 1, 2, 3, 4,
wherein Φ and Ψ in the equation (9) are obtained by $$\Phi = L^{-1}(s\epsilon - A)^{-1} \quad (10)$$

$$\Psi = \int_0^T (T - \tau)^* B dt \quad (11)$$

wherein

| $L^{-1}$ | inverse-Laplace transformation |
| $\epsilon$ | unit matrix. |

The input voltage $v_i$ which makes the output voltage of the filter arrive at the final target voltage $V_b$ can be obtained as below.

$$v_i(kT) = P_o^T * [\Phi(T)^{-n} * V_b - x(kT)] \quad (12)$$

k=0, 1, 2, 3, 4,
$P_o^T$ in the equation (12) can be obtained as a column vector forming the first line of the matrix P as below $$R^{-1} = P = \begin{bmatrix} P_0^T \\ P_1^T \\ P_2^T \\ P_i^T \\ P_{n-1}^T \end{bmatrix}$$

$$[r_0, r_1, r_2, \ldots r_{n-1}] = R$$

when the matrix is defined with $$\Phi(T)^* \Psi(T) = r_0$$
$$\Phi(T)^* \Psi(T) = r_1$$
$$\Phi(T)^* \Psi(T) = r_2$$
$$\vdots$$
$$\Phi(T)^* \Psi(T) = r_{n-1}$$

Provided $P_i^T$ is a line vector forming the i-th line of the matrix P.

In order to cause the output voltage of the filter to reach the final target voltage $V_b$ within the minimal time, the input voltage $v_i$ should be changed in accordance with the equation (12). The adding data circuit 203 in FIG. 28 calculates adding data corresponding to $v_i$ according to the equations (9) and (12). The digital adder 204 adds the adding data to the frequency controlled voltage data outputted from the ROM 201 and transmits the result to the D/A converter 6. This generates a voltage corresponding to $v_i$ in the output from the converter 6. As a result, the output voltage of the low-pass filter 202 reaches the voltage $V_b$ within the minimal time, even if the low-pass filter 202 is inserted, and the frequency switching at the VCO 4 can be conducted at high speed.

Figure 30:
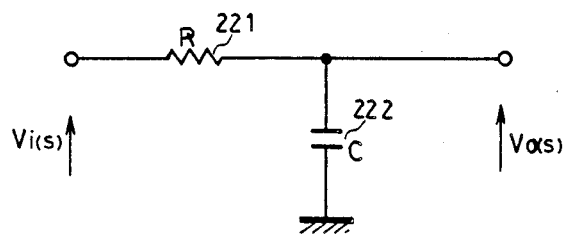
FIG. 30 is a circuit diagram to show the construction of the first order low-pass filter.

Description will now be given to the first order low-pass filter which is used as the low-pass filter shown in FIG. 28. FIG. 30 shows a first order low-pass filter comprising a resistor 221 and a capacitor 222. The transfer function G(s) indicating the relation of the input $V_i(s)$ with the output voltage $V_o(s)$ is expressed as below.

$$G(s) = V_0(s)/V_i(s) = \frac{1}{1 + s\tau} \quad (1)$$

wherein τ represents time constant (CR) determinable by the resistance R of the resistor 21 and the capacitance C of the capacitor 22. As the transfer function is of the first order, the number of state variable may be one. The state variable X is assumed to be $X = V_o$. Therefore, the state equation and the output equation corresponding to the equations (7) and (8) will become as below.

$$sX(s) = -(1/\tau)X(s) + (1/\tau)V_i(s) \quad (14)$$

$$V(s) = X(s) \quad (15)$$

They are expressed in time domain as below.

$$x(t) = -(1/\tau)x(t) + (1/\tau)v_i \quad (16)$$

$$v_o(t) = x(t) \quad (17)$$

The state transition equation is determined as below from the state equation, the output equation and the equation (9).

$$x((k + 1)T) = [\exp(-T/\tau)] \times (kT) + [1 - \exp(-T/\tau)]v_i(kT) \quad (18)$$

$$k = 0, 1, 2, 3, 4, \ldots$$

The input voltage $v_i(kT)$ which causes the voltage to reach the target voltage $V_b$ within the minimal time is determined by the equation (12) as below.

$$v_i(kT) = \frac{\exp(-T/\tau)}{1 - \exp(-T/\tau)} [[\exp(-T/\tau)]V_b - x(kT)] \quad (19)$$

$$k = 0, 1, 2, 3, 4, \ldots$$

Figure 31A:
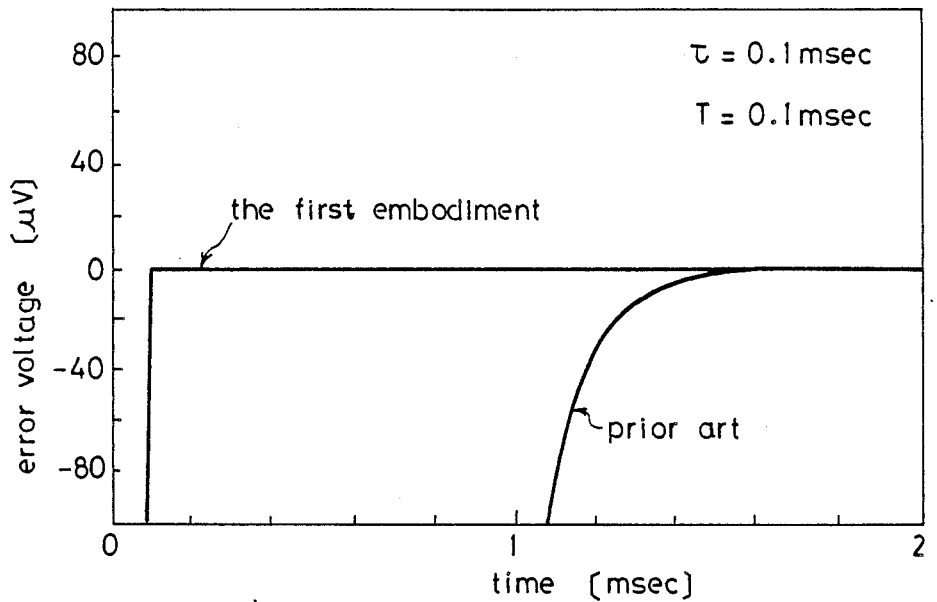
FIGS. 31a and 31b are charts to show transient behavior of the VCO controlling circuit when the first order low-pass filter is used.

Specific numerical values are substituted in the equations (18) and (19). It is as assumed that the phase noise in the output of VCO 4 caused by the output noise from the D/A converter 6 is reduced by 20 dB with an offset frequency of 12.5 kHz. If a low-pass filter shown in FIG. 30 is used, the time constant τ=C*R should be ca. 0.1 msec. If the low-pass filter of the type is inserted between the D/A converter 6 and the VCO 4, the response characteristics as shown in FIG. 31a are obtained. The graph indicates the characteristics when the output voltage $V_b$ of the low-pass filter 202 is denoted as 0 [V] before switching, and the final output voltage $V_b$ after switching is denoted as 5 [V] while the vertical axis plots the error voltage corresponding to the final voltage $V_b$ of the output voltage of the low-pass filter 202. As illustrated in the graph, the prior art needs a switching time of more than 1 msec as the time constant τ is set at 0.1 msec. According to the equations (18) and (19), the voltage reaches V within one sampling time (0.1 msec) if the input voltage of the low-pass filter is varied with sampling time interval T=0.1 msec. In order to obtain the output voltage shown in FIG. 31a, the voltage shown in FIG. 31b should be supplied to the input of the low-pass filter 202.

As stated in the foregoing, response time can be shortened by temporarily applying a high voltage on the low-pass filter input immediately after switching.

Figure 31B:
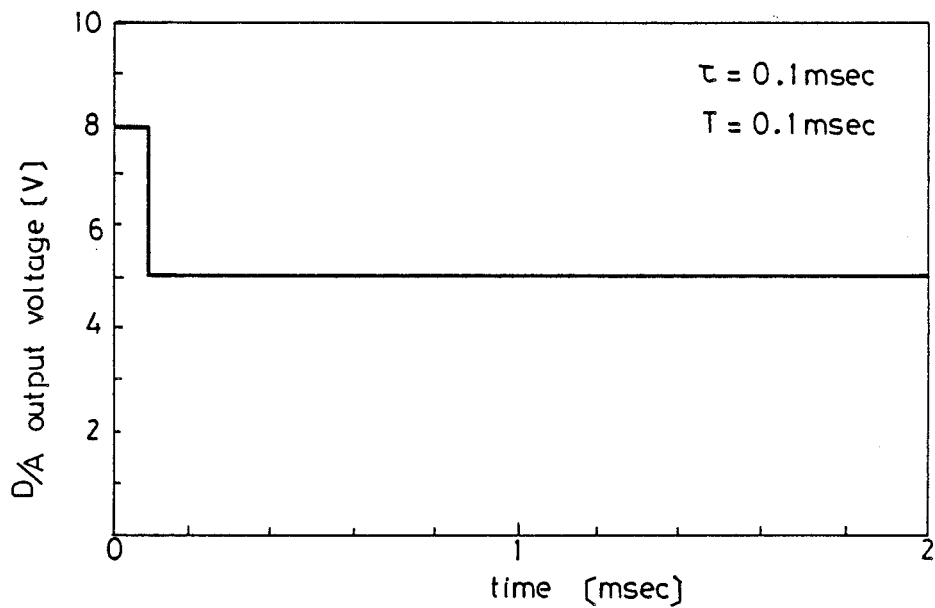
Figure 32A:
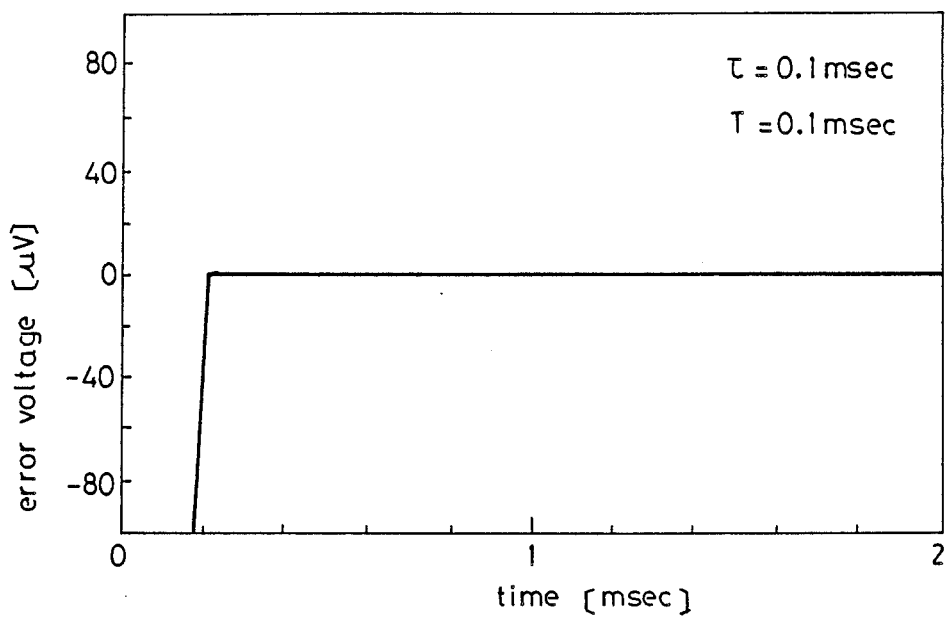
FIGS. 32a and 32b are views to show the transient behavior when the output from the D/A converter is saturated.
Figure 32B:
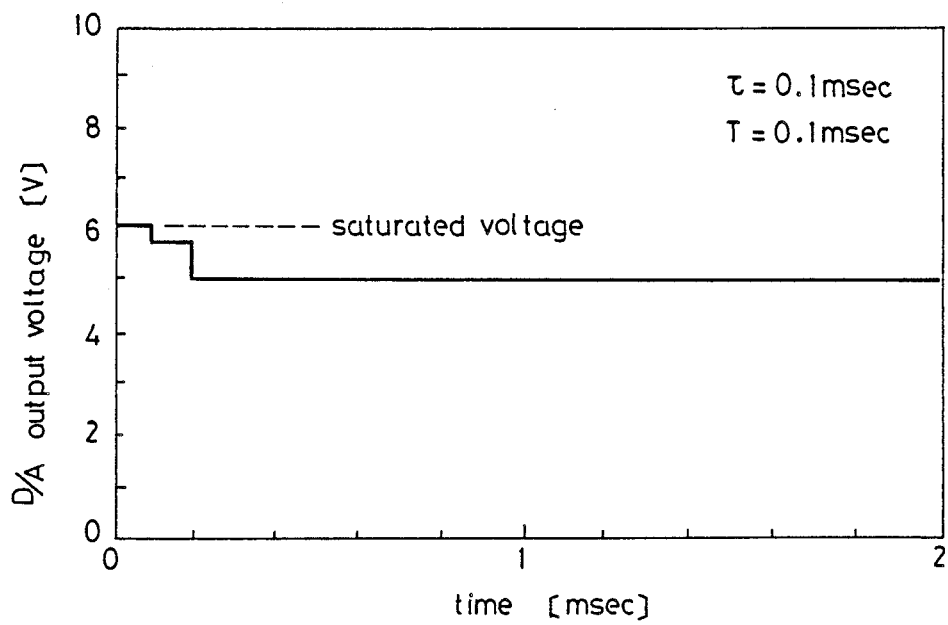

FIG. 31b shows the case where the input voltage of the low-pass filter 202 is 5 [V] which reaches 8 [V] immediately after switching. The frequency switching time can further be reduced if the sampling time interval T in equations (18) and (19) is further shortened. However, if T is reduced, the voltage immediately after switching increases further, and it would often be difficult to set such a high voltage in practice. Moreover, when a voltage which is difficult to set is calculated from the equation (19), as errors are caused in $v_1$ of the equation (18), the state cannot accurately be estimated. This prolongs the response time. Therefore, when the $v_1$ obtained by the equation (19) exceeds 6 [V], the maximum voltage (saturation voltage) which is outputtable from the D/A converter 6 is assumed to be 6 [V], the value of $v_1$ in the equation (18) is substituted with 6 [V]. The response characteristic for the above is expressed in FIGS. 32a and 32b. The output from the D/A converter 6 or the input voltage of the low-pass filter 202 is limited to 6 [V] as shown in FIG. 32b, but the response time can be limited within 2 sampling times or less (2 msec) as shown in FIG. 32a.

Figure 33:
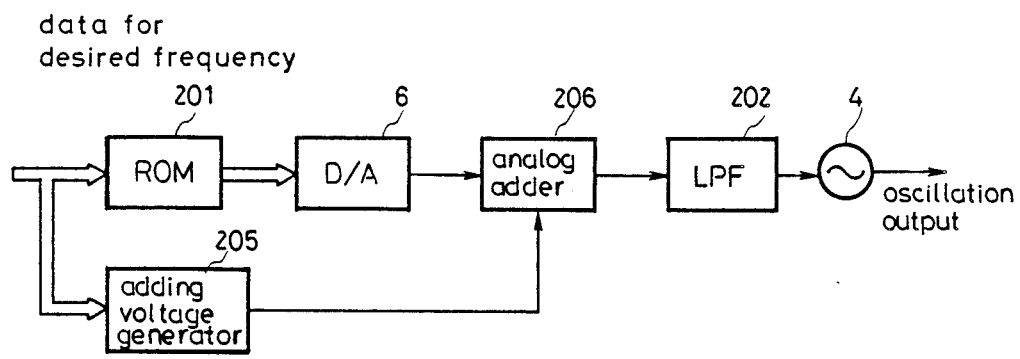
FIG. 33 is a block diagram to show the first embodiment of the VCO controlling circuit.

FIG. 33 is a block diagram to show the second embodiment of the VCO control circuit wherein the output data of the ROM 201 is converted from digital to analog by the D/A converter 6 and the output voltage therefrom is inputted at the analog adder 206. The output voltage of the adder voltage generating circuit 205 is supplied to the other input of the analog adder 206. The circuit 205 outputs adding voltage when the desired frequency data is inputted. An effect similar to that of the first embodiment can be obtained with the above construction.

The frequency can be switched at a high speed even if a low-pass filter is inserted in order to suppress the noise in the output from the D/A converter. Accordingly, by incorporating such VCO control circuits within the control circuits shown in FIGS. 15 and 16, a frequency synthesizer which is low noise and which can be switched in frequency at high speed can be realized.

Figure 1:
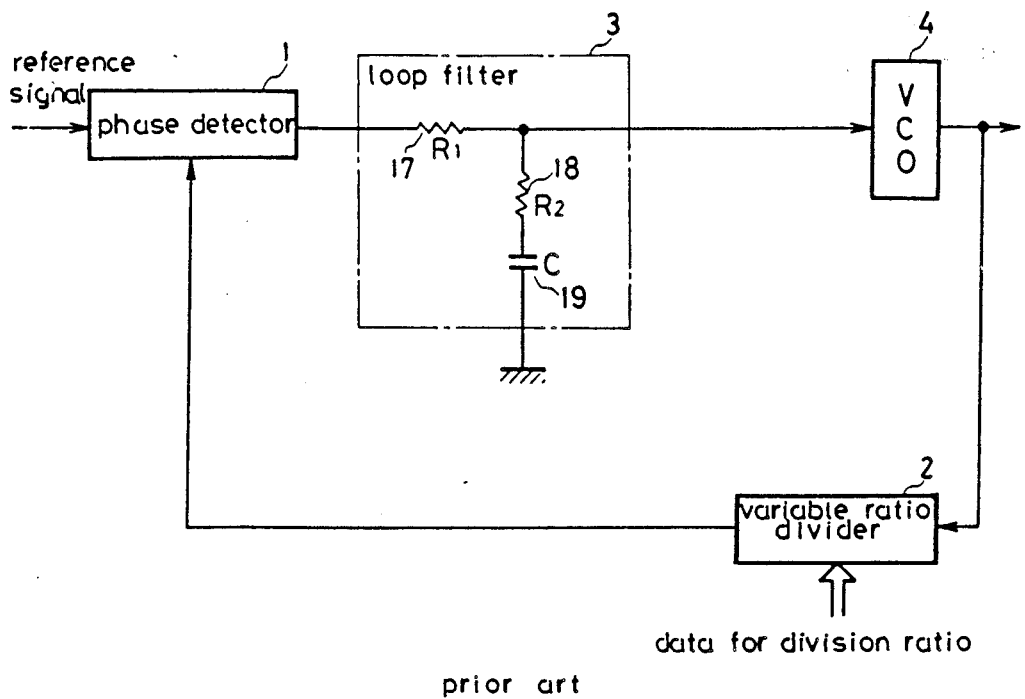
FIG. 1 is a block diagram of a conventional frequency synthesizer.
Figure 2:
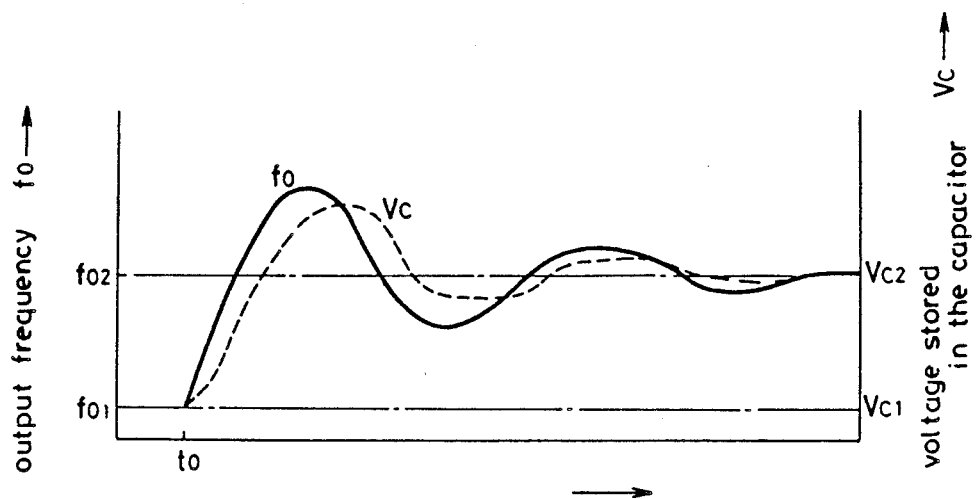
FIG. 2 is a graph to show an example of transient behavior of a PLL frequency synthesizer at the time of switching.
Figure 34:
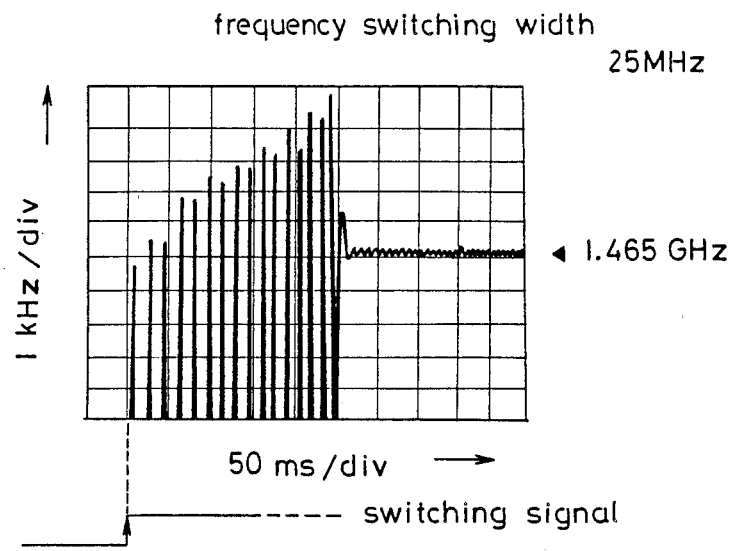
FIG. 34 is a view to show the frequency switching characteristics in the conventional embodiment shown in FIG. 1.
Figure 35:
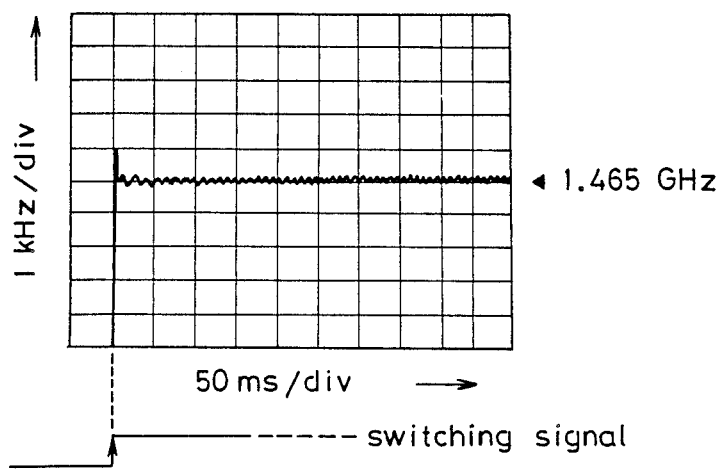
FIG. 35 is a view to show the frequency switching characteristics in the embodiment shown in FIG. 10.

FIGS. 34 and 35 show frequency switching characteristics when the oscillation frequency is switched from 1440 GHz to 1465 GHz. The reference frequency is assumed to be 6.25 kHz. FIG. 34 shows the characteristics obtained by the conventional frequency synthesizer of FIG. 1 while FIG. 35 indicates the characteristics obtained by the embodiment of this invention shown in FIG. 10. While the frequency varies across 250 msec after frequency switching in the prior art system, almost no frequency variation occurs in the embodiment of this invention to enable high speed frequency switching of less than 1 msec.

What is claimed is:

1. A frequency synthesizer, comprising:
a voltage controlled oscillator which produces an output having a frequency which is non-linearly dependent on an input control voltage,
a variable ratio divider which divides said output from said voltage controlled oscillator according to a variable division ratio,
a phase detector which compares a phase of a divided output from said variable ratio divider with a reference signal,
a loop filter which smooths an output from said phase detector and supplies the smoothed output to said voltage controlled oscillator, and
oscillation frequency switching means for switching an oscillation frequency of said voltage controlled oscillator by changing the division ratio of said variable divider;
wherein said oscillation frequency switching means includes:
voltage supply means for producing said control voltage, corresponding to a commanded oscillation frequency after switching, in synchronization with the change of said division ratio at said variable ratio divider;
voltage measuring means for measuring the smoothed output voltage from said loop filter before said switching of the oscillation frequency, and
wherein said voltage supply means includes control voltage compensation means for correcting said smoothed output voltage to produce said control voltage which is supplied to said voltage controlled oscillator, said correcting based on the measured voltage measured by said voltage measuring means and corresponding to a non-linearity of the voltage controlled oscillator;
wherein said voltage supply means is digital, and includes a D/A converter to produce an analog output signal, said voltage measuring means including an A/D converter;
and further comprising a variable bandwidth filter connected to an output of the D/A converter and having its output connected to said voltage supply means, wherein the oscillation frequency switching means includes a bandwidth limiting means for narrowing a bandwidth of said variable bandwidth filter after switching the oscillation frequency.

2. A frequency synthesizer, comprising:
a voltage controlled oscillator which produces an output having a frequency which is non-linearly dependent on an input control voltage,
a variable ratio divider which divides said output from said voltage controlled oscillator according to a variable division ratio,
a phase detector which compares a phase of a divided output from said variable ratio divider with a reference signal,
a loop filter which smooths an output from said phase detector and supplies the smoothed output to said voltage controlled oscillator, and
oscillation frequency switching means for switching an oscillation frequency of said voltage controlled oscillator by changing the division ratio of said variable divider;
wherein said oscillation frequency switching means includes:
voltage supply means for producing said control voltage, corresponding to a commanded oscillation frequency after switching, in synchronization with the change of said division ratio at said variable ratio divider;
voltage measuring means for measuring the smoothed output voltage from said loop filter before said switching of the oscillation frequency, and
wherein said voltage supply means includes control voltage compensation means for correcting said smoothed output voltage to produce said control voltage which is supplied to said voltage controlled oscillator, said correcting based on the measured voltage measured by said voltage measuring means and corresponding to a non-linearity of the voltage controlled oscillator;

and further comprising a variable bandwidth filter connected to receive said control voltage, and to an input of the voltage controlled oscillator, wherein the oscillation frequency switching means includes bandwidth limiting means for narrowing a bandwidth of said variable bandwidth filter after switching the oscillation frequency.

3. A frequency synthesizer, comprising:

a voltage controlled oscillator which produces an output having a frequency which is non-linearly dependent on an input control voltage, a variable ratio divider which divides said output from said voltage controlled oscillator according to a variable division ratio, a phase detector which compares a phase of a divided output from said variable ratio divider with a reference signal, a loop filter which smooths an output from said phase detector and supplies the smoothed output to said voltage controlled oscillator, and oscillation frequency switching means for switching an oscillation frequency of said voltage controlled oscillator by changing the division ratio of said variable divider;

wherein said oscillation frequency switching means includes:

voltage supply means for producing said control voltage, corresponding to a commanded oscillation frequency after switching, in synchronization with the change of said division ratio at said variable ratio divider;

voltage measuring means for measuring the smoothed output voltage from said loop filter before said switching of the oscillation frequency, and wherein said voltage supply means includes control voltage compensation means for correcting said smoothed output voltage to produce said control voltage which is supplied to said voltage controlled oscillator, said correcting based on the measured voltage measured by said voltage measuring means and corresponding to a non-linearity of the voltage controlled oscillator;

wherein said voltage supply means is digital, and includes a D/A converter to produce an analog output signal, said voltage measuring means including an A/D converter;

and further comprising a low-pass filter, connected between an output of the D/A converter and said input control voltage, and wherein said voltage supply means includes means for sequentially setting plural different voltages before setting said control voltage at the D/A converter output corresponding to the frequency after switching.

4. A frequency synthesizer, comprising:

a voltage controlled oscillator which produces an output frequency that is dependent on an input control voltage applied to said voltage controlled oscillator, a variable ratio divider which divides the output frequency from said voltage controlled oscillator, a phase detector which compares a phase of an output of said variable ratio divider with a phase of a reference signal, a loop filter which smooths the output of the phase detector to produce a smoothed output and supplies it to said voltage controlled oscillator, and an oscillation frequency switching means for commanding switching of an oscillation frequency of said voltage controlled oscillator, by changing a division ratio of said variable ratio divider;

wherein said oscillation frequency switching means includes voltage supply means for supplying a voltage corresponding to a commanded oscillation frequency after switching to said voltage controlled oscillator via a D/A converter in synchronization with a change of the division ratio of said variable ratio divider, wherein said variable ratio divider is a resettable variable ratio divider including a reset means, and the oscillation frequency switching means includes means for resetting said variable ratio divider by using the reference signal inputted in the phase detector as a trigger.

5. The frequency synthesizer as claimed in claim 4 further comprising:

a loop switch provided at an input of the loop filter to switch the output of said phase detector, and wherein the oscillation frequency switching means includes ON/OFF switch means which opens said loop switch before switching the oscillation frequency, and closes said loop switch after the variable ratio divider is reset.

6. The frequency synthesizer as claimed in claim 4 wherein the voltage controlled oscillator is an oscillator in which oscillation frequency corresponding to the input voltage changes non-linearly, and further comprising:

a voltage measuring means, which measures via an A/D converter the voltage supplied from the loop filter to the voltage controlled oscillator before switching of the oscillation frequency, and the voltage supply means includes control voltage compensation means for producing a correction factor which corrects the voltage supplied to said voltage controlled oscillator corresponding to the non-linearity of the voltage controlled oscillator and based on the measured value of said voltage measuring means.

7. The frequency synthesizer as claimed in claim 4 further comprising:

a sample hold circuit connected between an output of the D/A converter and said input control voltage, and means for stopping the power supply to said D/A converter after a control voltage is held at the sample hold circuit.

8. The frequency synthesizer as claimed in claim 7 wherein the loop filter includes a capacitor, which is also part of the sample hold circuit.

9. The frequency synthesizer as claimed in claim 4 further comprising:

a variable bandwidth filter connected between an output of the D/A converter and said input control voltage, and wherein the oscillation frequency switching means includes a bandwidth limiting means which narrows the bandwidth of said variable bandwidth filter after switching of the oscillation frequency.

10. The frequency synthesizer as claimed in claim 4 further comprising a variable bandwidth filter which is connected to an output of the voltage controlled oscillator, and the oscillation frequency switching means includes a bandwidth limiting means which narrows the bandwidth of said variable bandwidth filter after switching of oscillation frequency.

11. The frequency synthesizer as claimed in claim 4 further comprising a low-pass filter connected between an output of the D/A converter and said input control voltage, and the voltage supply means includes a means which sequentially sets plural different voltages at frequency switching before setting a steering voltage corresponding to the frequency after switching at the D/A converter.

* * * * *